United States Patent
Son et al.

(10) Patent No.: US 11,552,153 B2
(45) Date of Patent: Jan. 10, 2023

(54) ORGANIC LIGHT EMITTING DISPLAY DEVICE

(71) Applicant: Samsung Display Co., Ltd., Yongin-si (KR)

(72) Inventors: Euncheol Son, Cheonan-si (KR); Dongbin Um, Cheonan-si (KR); Kichang Lee, Gwacheon-si (KR); Myoung-Ha Jeon, Cheonan-si (KR); Sangkyu Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/513,343

(22) Filed: Jul. 16, 2019

(65) Prior Publication Data

US 2019/0341443 A1 Nov. 7, 2019

Related U.S. Application Data

(63) Continuation of application No. 15/662,512, filed on Jul. 28, 2017, now Pat. No. 10,388,713.

(30) Foreign Application Priority Data

Jan. 10, 2017 (KR) .......................... 10-2017-0003750

(51) Int. Cl.
*H01L 51/00* (2006.01)
*H01L 27/32* (2006.01)
(Continued)

(52) U.S. Cl.
CPC ........ *H01L 27/3276* (2013.01); *H01L 27/323* (2013.01); *H01L 27/3248* (2013.01);
(Continued)

(58) Field of Classification Search
CPC ......... H01L 2251/5338; H01L 51/5253; H01L 51/0097
See application file for complete search history.

(56) References Cited

U.S. PATENT DOCUMENTS 9,214,640 B2   12/2015   Lee et al.
9,276,055 B1   3/2016   Son et al.
(Continued)

FOREIGN PATENT DOCUMENTS

EP          2983225        2/2016
KR    10-2014-0024191      2/2014
(Continued)

OTHER PUBLICATIONS

Extended European Search Report dated May 2, 2018, issued in the European Patent Application No. 17193720.4.
(Continued)

*Primary Examiner* — Sarah K Salerno
(74) *Attorney, Agent, or Firm* — H.C. Park & Associates, PLC

(57) ABSTRACT

An organic light emitting display device includes a display panel including a display region where a plurality of pixels are disposed, a pad region including a bending region and a pad electrode region where pad electrodes are disposed, a polarizing layer disposed in the display region, and a lower protection film disposed on a lower surface of the display panel. The lower protection film includes a first and a second lower protection film pattern. The first lower protection film pattern is disposed in the display region, and the second lower protection film pattern in the pad electrode region such that a lower surface of the display panel in the bending region is exposed. The bending protection layer has an upper
(Continued)

surface with a height that is less than a height of the polarizing layer, and is disposed in the bending region on the display panel.

17 Claims, 20 Drawing Sheets

(51) Int. Cl.
*H01L 51/52* (2006.01)
*H01L 51/56* (2006.01)

(52) U.S. Cl.
CPC ........ *H01L 51/0097* (2013.01); *H01L 51/529* (2013.01); *H01L 51/5253* (2013.01); *H01L 51/5281* (2013.01); *H01L 51/56* (2013.01); *H01L 2227/323* (2013.01); *H01L 2251/5338* (2013.01); *H01L 2251/558* (2013.01); *Y02E 10/549* (2013.01)

(56) References Cited

U.S. PATENT DOCUMENTS

| | | | |
|---|---|---|---|
| 9,287,329 | B1 | 3/2016 | Lee et al. |
| 9,425,418 | B2 | 8/2016 | Kwon et al. |
| 9,553,275 | B2 | 1/2017 | Kim et al. |
| 9,691,345 | B2 | 6/2017 | Park et al. |
| 9,798,414 | B2 | 10/2017 | Kim et al. |
| 2005/0241758 | A1 | 11/2005 | Kim et al. |
| 2009/0306321 | A1 | 12/2009 | Yasuhiro |
| 2015/0146386 | A1* | 5/2015 | Namkung ......... G02F 1/133305 361/749 |
| 2015/0212548 | A1 | 7/2015 | Namkung et al. |
| 2015/0276992 | A1 | 10/2015 | Park et al. |
| 2016/0077267 | A1 | 3/2016 | Inagaki |
| 2016/0260915 | A1 | 9/2016 | Park et al. |
| 2016/0275830 | A1 | 9/2016 | You et al. |
| 2016/0336523 | A1 | 11/2016 | Kwon et al. |
| 2017/0047547 | A1* | 2/2017 | Son ................ H01L 25/167 |
| 2017/0118859 | A1* | 4/2017 | Kang ............... G02F 1/133385 |
| 2018/0183001 | A1* | 6/2018 | Lee ................ H01L 51/0097 |

FOREIGN PATENT DOCUMENTS

| | | |
|---|---|---|
| KR | 10-2014-0085956 | 7/2014 |
| KR | 10-2014-0118676 | 8/2014 |
| KR | 10-2016-0106829 | 9/2016 |
| KR | 10-2016-0124286 | 10/2016 |
| WO | 2016/093483 | 6/2016 |

OTHER PUBLICATIONS

Non-Final Office Action dated May 3, 2018, in U.S. Appl. No. 15/662,512.
Final Office Action dated Nov. 9, 2018, in U.S. Appl. No. 15/662,512.
Advisory Action dated Jan. 24, 2019, in U.S. Appl. No. 15/662,512.
Notice of Allowance dated Apr. 3, 2019, in U.S. Appl. No. 15/662,512.

* cited by examiner

ORGANIC LIGHT EMITTING DISPLAY DEVICE

CROSS-REFERENCE TO RELATED APPLICATION

This application is a Continuation of U.S. patent application Ser. No. 15/662,512, filed Jul. 28, 2017, which claims priority from and the benefit of Korean Patent Application No. 10-2017-0003750, filed on Jan. 10, 2017, which is hereby incorporated by reference for all purposes as if fully set forth herein.

BACKGROUND

Field

Exemplary embodiments relate to organic light emitting display devices. More particularly, exemplary embodiments relate to flexible organic light emitting display devices.

Discussion of the Background

A flat panel display (FPD) device is widely used as a display device for electronic devices because such FPD devices are lightweight and thin compared to cathode-ray tube (CRT) display devices. Typical examples of the FPD device are a liquid crystal display (LCD) device and an organic light emitting display (OLED) device.

Recently, a flexible OLED device capable of bending or folding a portion thereof has been developed. The flexible OLED device includes lower and upper substrates of a display panel which have flexible materials. For example, the lower substrate included in the display panel may be formed of a flexible substrate, and the upper substrate included in the display panel may have a thin film encapsulation structure. In addition, the flexible OLED device may further include a polarizing layer and a touch screen electrode layer that are located on an upper surface of the display panel and a lower protection film that is located on a lower surface of the display panel.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide an organic light emitting display device.

Additional aspects will be set forth in the detailed description which follows, and, in part, will be apparent from the disclosure, or may be learned by practice of the inventive concepts.

According to exemplary embodiments, an organic light emitting display (OLED) device includes a display panel, a polarizing layer, a lower protection film, and a bending protection layer. The display panel has a display region where a plurality of pixels are disposed and a pad region that is located in a first side of the display region, and the pad region has a bending region located in a portion of the pad region that is adjacent to the display region and a pad electrode region located in a remaining portion of the pad region. Pad electrodes are disposed in the pad electrode region. The polarizing layer is disposed in the display region on the display panel. The lower protection film is disposed on a lower surface of the display panel, and includes a first lower protection film pattern and a second lower protection film pattern. The first lower protection film pattern is disposed in the display region, and the second lower protection film pattern is disposed in the pad electrode region of the pad region such that a lower surface of the display panel located in the bending region is exposed. The bending protection layer has an upper surface with a height that is less than a height of the polarizing layer, and is disposed in the bending region on the display panel.

In an exemplary embodiment, the polarizing layer may be in contact with the bending protection layer in a portion where the display region and the bending region are adjacent to each other.

In an exemplary embodiment, the polarizing layer and the bending protection layer may be in contact with the display panel.

In an exemplary embodiment, the display region may include a light emitting region, a peripheral region. A light may be emitted in the light emitting region. The peripheral region may surround the light emitting region, and a plurality of wirings may be disposed in the peripheral region. A portion of the peripheral region may be interposed between the light emitting region and the bending region.

In an exemplary embodiment, the polarizing layer may be disposed in the light emitting region and a portion of the peripheral region that is located adjacent to the bending region on the display panel. The bending protection layer may be disposed in a portion of the peripheral region that is located adjacent to the bending region, the bending region, and a portion of the pad electrode region.

In an exemplary embodiment, the protection layer may be in contact with the polarizing layer in the peripheral region that is located adjacent to the bending region.

In an exemplary embodiment, the bending protection layer may further include a protrusion portion in the peripheral region that is located adjacent to the bending region.

In an exemplary embodiment, a height from a lower surface of the bending protection layer to the protrusion portion may be greater than a height of the polarizing layer.

In an exemplary embodiment, a height of the polarizing layer may be in a range between about 60 micrometers and about 120 micrometers.

In an exemplary embodiment, a first height of the polarizing layer may be less than a second height from a lower surface of the bending protection layer to the protrusion portion, and a height difference between the first and second heights may range between about 10 micrometers and about 30 micrometers.

In an exemplary embodiment, the first lower protection film pattern may be disposed in the light emitting region and the peripheral region on a lower surface of the display panel, and the first lower protection film pattern and the bending protection layer may overlap in the peripheral region.

In an exemplary embodiment, a distance where the first lower protection film pattern and the bending protection layer overlap may be less than or equal to about 350 micrometers.

In an exemplary embodiment, the bending protection layer may have a Young's modulus that is in a range between 0.1 GPa and 0.7 GPa.

In an exemplary embodiment, the OLED device may further include connection electrodes disposed between the bending protection layer and the display panel, and the connection electrodes may be electrically connected to the pixels and the pad electrodes.

In an exemplary embodiment, the bending region may be bent on an axis with respect to a first direction corresponding to a row direction in a plan view of the OLED device, and the second lower protection film pattern may be disposed on a lower surface of the first protection film pattern.

In an exemplary embodiment, the OLED device may further include a first lower adhesion layer interposed between the lower protection film and the display panel, and the first lower adhesion layer may include a first adhesion layer pattern and a second adhesion layer pattern. The first adhesion layer pattern may be disposed in the display region, and the second adhesion layer pattern may be disposed in the pad electrode region of the pad region such that a lower surface of the display panel that is located in the bending region is exposed.

In an exemplary embodiment, each of the plurality of the pixels included in the display panel may include a substrate disposed on the lower protection film, a semiconductor element disposed on the substrate, a lower electrode disposed on the semiconductor element, a light emitting layer disposed on the lower electrode, an upper electrode disposed on the light emitting layer, and a thin film encapsulation structure disposed on the upper electrode.

In an exemplary embodiment, the polarizing layer may be in direct contact with the thin film encapsulation structure.

In an exemplary embodiment, the semiconductor element may include an active layer, a gate insulation layer, a gate electrode, an insulating interlayer, and source and drain electrodes. The active layer may be disposed on the substrate. The gate insulation layer may be disposed on the active layer, and may expose an upper surface of the substrate that is located in the bending region. The gate electrode may be disposed on the gate insulation layer. The insulating interlayer may be disposed on the gate electrode, and may expose an upper surface of the substrate that is located in the bending region. The source and drain electrodes may be disposed on the insulating interlayer.

In an exemplary embodiment, the OLED device may further include a touch screen electrode layer disposed on the polarizing layer and an upper adhesion layer interposed between the polarizing layer and the touch screen electrode layer.

In an exemplary embodiment, the OLED device may further include a heat sink plate disposed on a lower surface of the lower protection film and a second lower adhesion layer interposed between the lower protection film and the heat sink plate.

In an exemplary embodiment, the OLED device may further include a third lower adhesion layer interposed between the heat sink plate and the second lower protection film pattern when the OLED device is bent.

As the OLED device according to an exemplary embodiment includes the bending protection layer having a relatively thin thickness, the OLED device may prevent the touch screen electrode layer and a flexible printed circuit board of the touch screen electrode layer from being damaged by the bending protection layer. In addition, as the bending protection layer includes the protrusion portion, the bending protection layer may not be separated from the polarizing layer when the OLED device is bent because a contact area of the polarizing layer and the bending protection layer is relatively increased.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
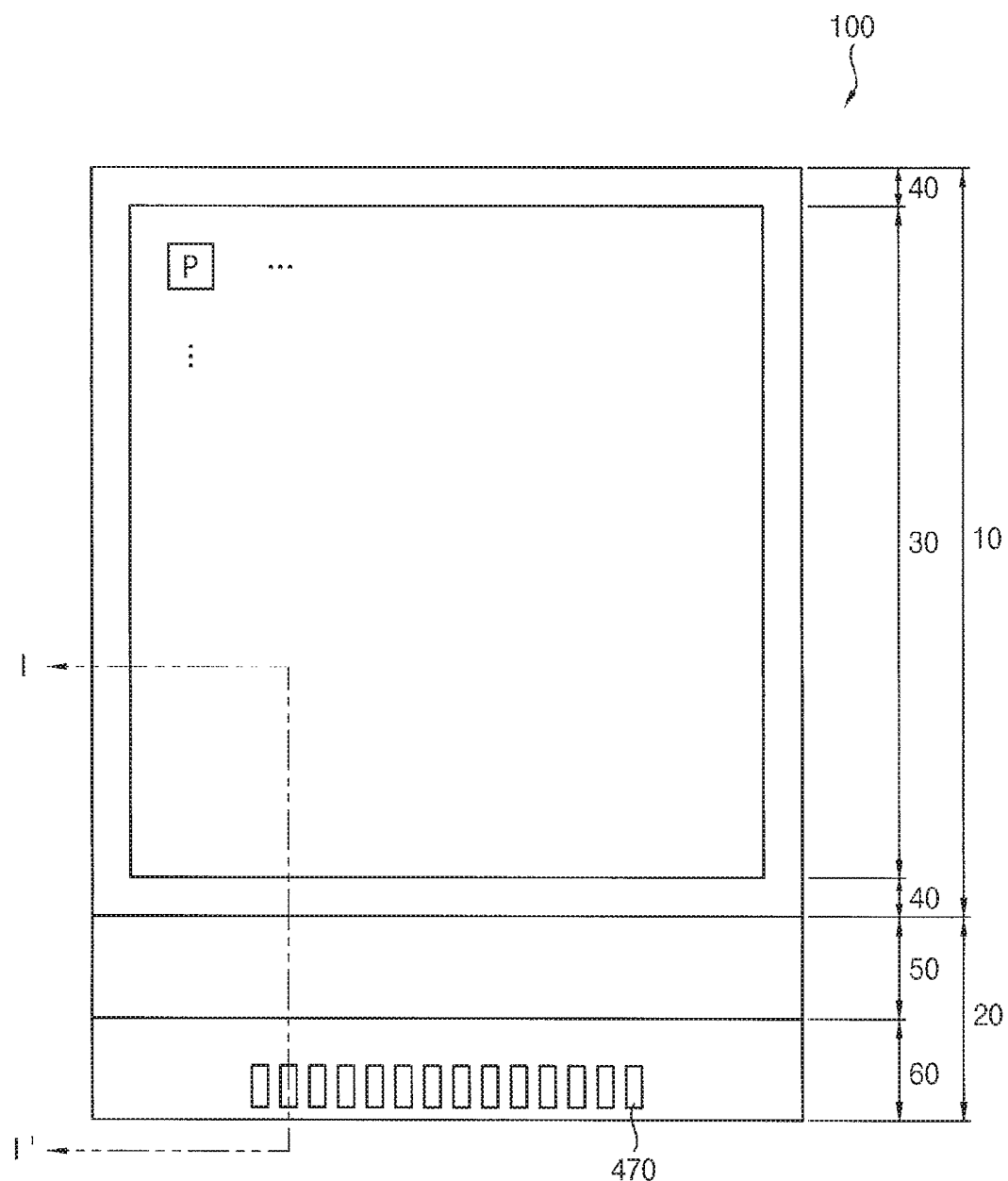
FIG. 1 is a plan view illustrating an organic light emitting display (OLED) device in accordance with an exemplary embodiment.
Figure 1:
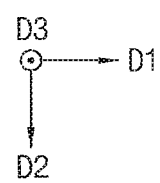

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
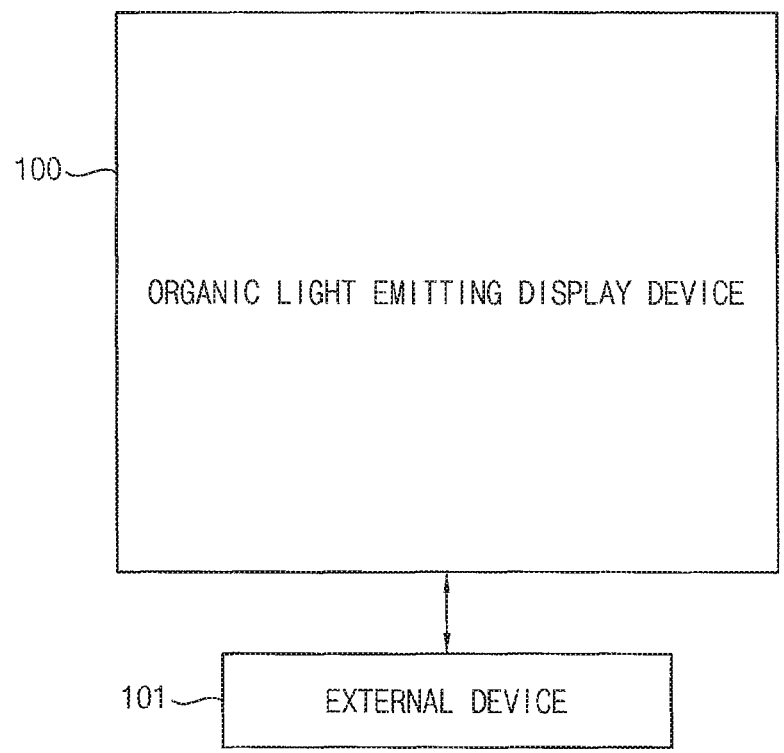
FIG. 2 is a block diagram for describing an external device electrically connected to the OLED device of FIG. 1.

FIG. 1 is a plan view illustrating an organic light emitting display (OLED) device in accordance with an exemplary embodiment, and FIG. 2 is a block diagram for describing an external device electrically connected to the OLED device of FIG. 1.

Referring to FIG. 1 and FIG. 2, an OLED device 100 may include a display panel, a polarizing layer, a touch screen electrode layer, a lower protection film, bending protection layer, etc.

An exemplary display panel may have a display region 10 and a pad region 20. A plurality of pixels P may be disposed in the display region 10, and the pad region 20 may be located adjacent to a first side of the display region 10. Pad electrodes 470 that are electrically connected to an external device may be disposed in the pad region 20.

The display region 10 may include a light emitting region 30 where light is emitted and a peripheral region 40 that surrounds the light emitting region 30. In an exemplary embodiment, the pixels P emitting light may be disposed in the light emitting region 30, and a plurality of wirings may be disposed in the peripheral region 40. The wirings may be electrically connected to the pad electrodes 470 and the pixels P. For example, the wirings may include data signal wirings, scan signal wirings, light emission signal wirings, power supply voltage wirings, etc. In addition, a scan driver, a data driver, etc., may be disposed in the peripheral region 40.

In an exemplary embodiment, a width of the peripheral region 40 surrounding the light emitting region 30 of FIG. 1 may be constant, but exemplary embodiments are not limited thereto. For example, the peripheral region 40 may include a first region extending in a first direction D1 that corresponds to a row direction in a plan view of the OLED device 100 and a second region extending in a second direction D2 that corresponds to a column direction in a plan view of the OLED device 100. For example, the first region of the peripheral region 40 may be located adjacent to the top of the display panel 200 and a bending region 50, and the second region of the peripheral region 40 may be located in both lateral portions of the display panel 200. Here, a width extending in the first direction D1 of the second region may be relatively narrower than a width extending in the second direction D2 of the first region.

The pad region 20 may include a bending region 50 located in a portion of the pad region 20 that is adjacent to the display region 10 and a pad electrode region 60 located in a remaining portion of the pad region 20. Here, a portion of the peripheral region 40 may be interposed between the light emitting region 30 and the bending region 50. In addition, the bending region 50 may be interposed between the display region 10 and the pad electrode region 60, and the pad electrodes 470 may be disposed in the pad electrode region 60. When the bending region 50 is bent, the pad electrode region 60 may be located on a lower surface of the OLED device 100. In an exemplary embodiment, the OLED device 100 may further include connection electrodes. The bending protection layer may be disposed in a portion of the display region 10, the bending region 50, and a portion of the pad electrode region 60 on the display panel. The connection electrodes may be disposed between the bending protection layer and the display panel, and may be electrically connected to the wirings and the pad electrodes 470. As illustrated in FIG. 2, the pixels P disposed in the light emitting region 30 and an external device 101 that is electrically connected to the pad electrodes 470 may be electrically connected through the connection electrodes disposed in the bending region 50 and the wirings disposed in the peripheral region 40. For example, the external device 101 and the OLED device 100 may be electrically connected through a flexible printed circuit board (FPCB). The external device 101 may provide a data signal, a scan signal, a light emission signal, a power supply voltage, etc. to the OLED device 100. In addition, a driving integrated circuit may be mounted (e.g., installed) in the FPCB. In exemplary embodiments, the driving integrated circuit may be mounted in the display panel 200 near the pad electrodes 470.

The polarizing layer and the touch screen electrode layer may be disposed in the display region 10 on the display panel. In an exemplary embodiment, the polarizing layer may be disposed on the display panel, and the touch screen electrode layer may be disposed on the polarizing layer.

The lower protection film may be disposed on a lower surface of the display panel, and may protect the display panel.

Figure 3:
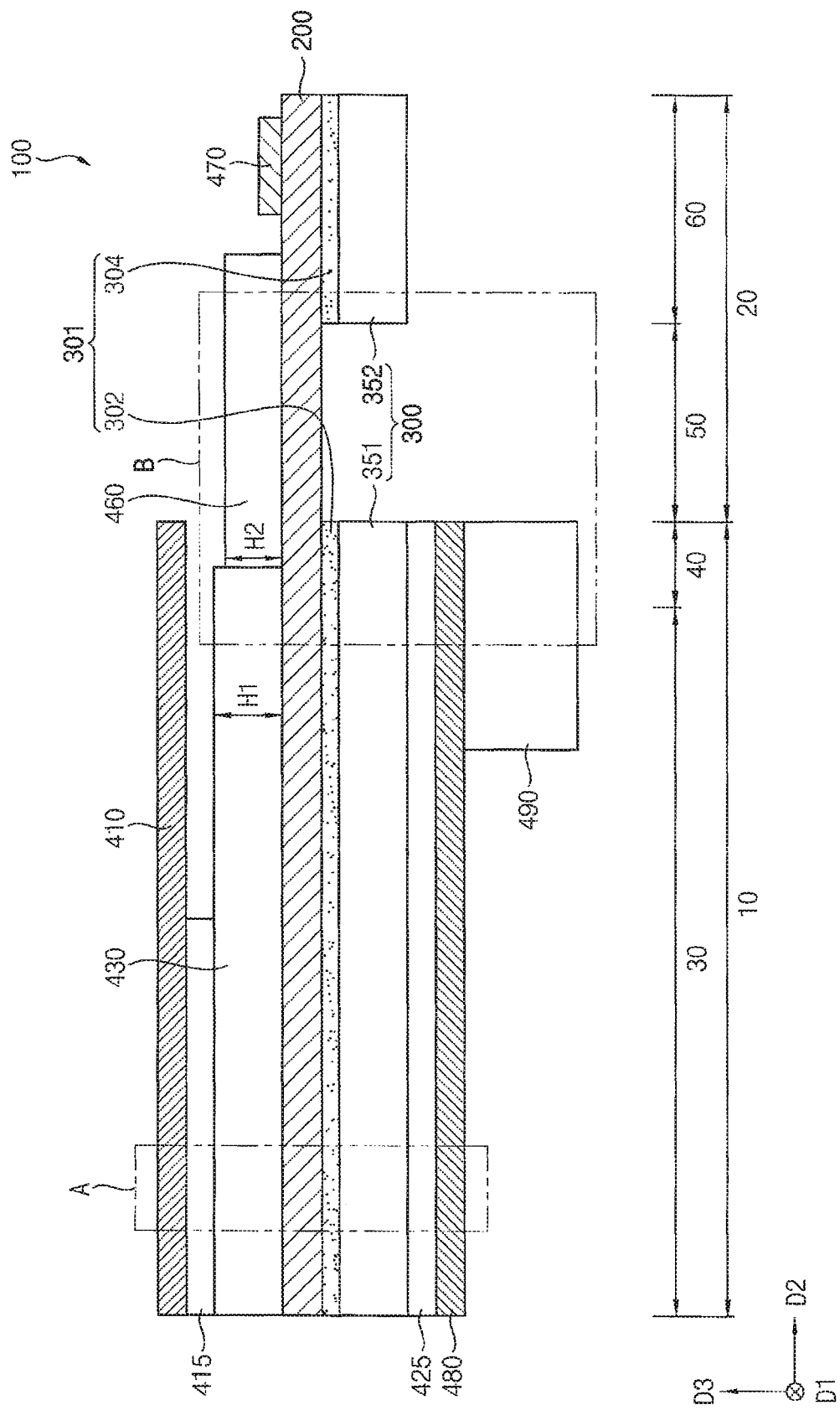
FIG. 3 is a cross-sectional view taken along a line I-I' of FIG. 1.
Figure 4:
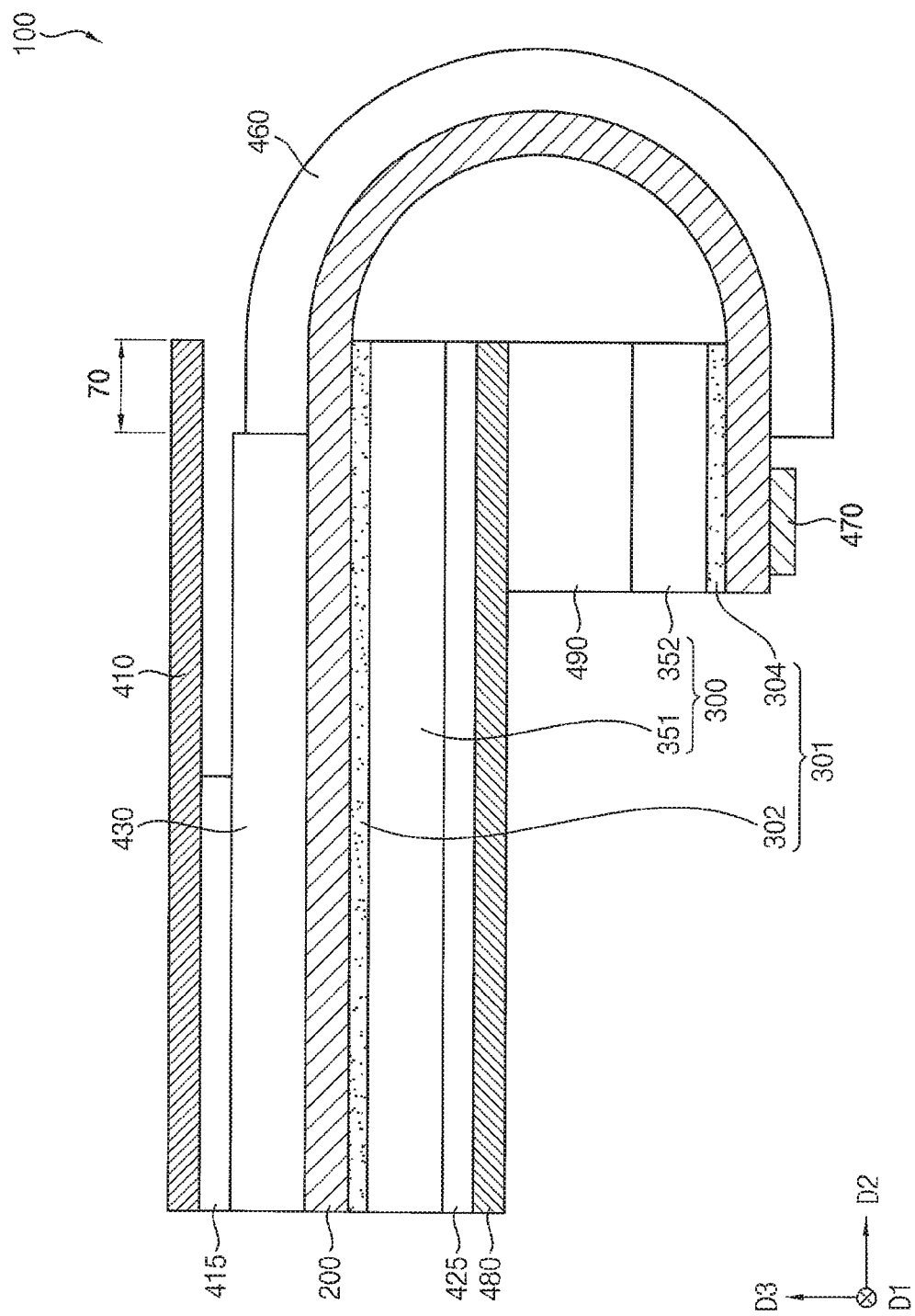
FIG. 4 is a cross-sectional view describing a bent shape of the OLED device of FIG. 3.

FIG. 3 is a cross-sectional view taken along a line I-I' of FIG. 1, and FIG. 4 is a cross-sectional view describing a bent shape of the OLED device of FIG. 3.

Referring to FIG. 1, FIG. 3, and FIG. 4, the OLED device 100 may include a display panel 200, a first lower adhesion layer 301, a lower protection film 300, a second lower adhesion layer 425, a heat sink plate 480, a third lower adhesion layer 490, a polarizing layer 430, an upper adhesion layer 415, a touch screen electrode layer 410, a bending protection layer 460, a pad electrode 470, etc. Here, the lower protection film 300 may include a first lower protection film pattern 351 and a second lower protection film pattern 352, and the first lower adhesion layer 301 may include a first lower adhesion layer pattern 302 and a second lower adhesion layer pattern 304. In exemplary embodiments, the polarizing layer 430 may have a first height H1, and the bending protection layer 460 may have a second height H2 that is less than the first height H1.

As described above, the display panel 200 may have a display region 10 and a pad region 20. The display region 10 may include a light emitting region 30 and a peripheral region 40, and the pad region 20 may include a bending region 50 and a pad electrode region 60. In addition, the peripheral region 40 illustrated in FIG. 3 may include the peripheral region 40 interposed between the light emitting region 30 and the bending region 50 illustrated in FIG. 1.

In exemplary embodiments, pixels P which emit light may be disposed in the light emitting region 30, and a plurality of wirings may be disposed in the peripheral region 40. The wirings may be electrically connected to the pad electrode 470 and the pixels P.

The bending region 50 of the pad region 20 may be interposed between the pad electrode region 60 and the peripheral region 40 of the display region 10, and the pad electrode 470 may be disposed in the pad electrode region 60.

Referring again to FIG. 4, when the bending region 50 is bent, the pad electrode region 60 may be located on a lower surface of the OLED device 100. In an exemplary embodiment, the bending region 50 may be bent on an axis with respect to a first direction D1, and the second lower protection film pattern 352 may be disposed on a lower surface of the heat sink plate 480. After the bending region 50 is bent, the third lower adhesion layer 490 may be interposed between the second lower protection film pattern 352 and the heat sink plate 480. For example, the second lower protection film pattern 352 and the heat sink plate 480 may be fixed by the third lower adhesion layer 490.

Referring again to FIG. 1 and FIG. 3, the lower protection film 300 may be disposed on a lower surface of the display panel 200. In an exemplary embodiment, the lower protection film 300 may include the first lower protection film pattern 351 that is disposed on the lower surface of the display region 10 and the second lower protection film pattern 352 that is disposed on the lower surface of the pad electrode region 60 such that a lower surface of the display panel 200 located in the bending region 50 is exposed. For example, the lower protection film 300 may expose a lower surface of the display panel 200 in the bending region 50. In addition, to bond (or attach) the lower protection film 300 and the display panel 200, the first lower adhesion layer 301 may be interposed between the lower protection film 300 and the display panel 200. The first lower adhesion layer 301 may include the first lower adhesion layer pattern 302 that overlaps the first lower protection film pattern 351 and the second lower adhesion layer pattern 304 that overlaps the second lower protection film pattern 352. The first lower adhesion layer 301 may be in contact with a lower surface of the display panel 200.

The heat sink plate 480 may be disposed on a lower surface of the lower protection film 300, and the second lower adhesion layer 425 may be interposed between the lower protection film 300 and the heat sink plate 480 to bond the lower protection film 300 and the heat sink plate 480.

The polarizing layer 430 may be disposed in the display region 10 on the display panel 200. For example, the polarizing layer 430 may be disposed in the light emitting region 30 and a portion of the peripheral region 40 on the display panel 200, and may be in contact with the display panel 200. In an exemplary embodiment, the polarizing layer 430 may have a first height H1. The first height H1 may range between about 60 micrometers and about 120 micrometers. In an exemplary embodiment, for example, the first height H1 of the polarizing layer 430 may be about 100 micrometers.

The touch screen electrode layer 410 may be disposed on the polarizing layer 430, and the upper adhesion layer 415 may be interposed between the polarizing layer 430 and the touch screen electrode layer 410 to bond the polarizing layer 430 and the touch screen electrode layer 410.

The touch screen electrode layer 410 may be connected to a FPBC in the peripheral region 40, for example, the FPCB may be disposed in a bent manner on the bending protection layer 460 and the pad electrode 470 when the OLED device 100 is bent. In an exemplary embodiment, the touch screen electrode layer 410 may be disposed on the display panel 200, and the polarizing layer 430 may be disposed on the touch screen electrode layer 410.

The bending protection layer 460 may be disposed in a portion of the display region 10 or a portion of the peripheral region 40, the bending region 50, and a portion of the pad electrode region 60 on the display panel 200. In addition, bending protection layer 460 may be in contact with the display panel 200. In an exemplary embodiment, the polarizing layer 430 may be in contact with the bending protection layer 460 in a portion (e.g., the peripheral region 40) where the display region 10 and the bending region 50 are adjacent to each other. Connection electrodes, which will be described below, may be disposed between the bending protection layer 460 and the display panel 200. The connection electrodes may be electrically connected to the wirings disposed in the peripheral region 40 and the pad electrode 470. Pixels P disposed in the light emitting region 30 and an external device 101 that is electrically connected to the pad electrode 470 may be electrically connected through the connection electrodes disposed in the bending region 50 and the wirings disposed in the peripheral region 40. In an exemplary embodiment, a thickness of the bending protection layer 460 may be determined such that a neutral plane in the bending region 50 is located within a portion where the connection electrodes are disposed. For example, when the bending region 50 is bent, the connection electrodes may not be broken or cut because the neutral plane of the bending region 50 is located within the portion where the connection electrodes are disposed.

To manufacture an OLED device 100 with a relatively thin thickness, a thickness of the polarizing layer 430 may be manufactured in a thin manner. As the thickness (a first height H1) of the polarizing layer 430 becomes thinner, a distance between the display panel 200 and the touch screen electrode layer 410 may be reduced. For example, when a conventional bending protection layer, which has a relatively thick thickness, is disposed on the display panel 200, the conventional bending protection layer may be in direct contact with the touch screen electrode layer 410 and a FPCB of the touch screen electrode layer 410, and the touch screen electrode layer 410 and the FPCB may be damaged by the conventional bending protection layer. As such, in accordance with an exemplary embodiment, a bending protection layer 460 may be provided that has a relatively thin thickness and a high Young's modulus.

In an exemplary embodiment, the bending protection layer 460 may have an upper surface which has a height less than a height of an upper surface of the polarizing layer 430 (e.g., the first height H1). For example, the bending protection layer 460 may have a second height H2, and the second height H2 may be less than the first height H1. The second height H2 may range between about 50 micrometers and about 110 micrometers. In addition, the bending protection layer 460 may have the Young's modulus that ranges between 0.1 GPa and 0.7 GPa. Further, the bending protection layer 460 may overlap the first lower protection film pattern 351 in the peripheral region 40. A portion where the bending protection layer 460 and the first lower protection film pattern 351 overlap may be defined as an overlap distance 70. The overlap distance 70 may be less than or equal to about 350 micrometers. The bending protection layer 460 having a relatively high Young's modulus may have a relatively reduced overlap distance 70. For example, when the OLED device including a conventional bending protection layer having a relatively short overlap distance 70 is bent, the conventional bending protection layer may be separated or detached from the display panel 200 and the polarizing layer 430. In contrast, although the bending protection layer 460 according to exemplary embodiments has a relatively reduced overlap distance 70, the bending protection layer 460 may not be separated from the display panel 200 and the polarizing layer 430 because the bending protection layer 460 has the relatively high Young's modulus. Accordingly, as the bending protection layer 460 has a relatively short overlap distance 70, a width of the peripheral region 40 may be reduced or an area of the light emitting region 30 may be relatively increased. In addition, since the OLED device 100 includes the bending protection layer 460, damage to the touch screen electrode layer 410 and the FPCB may be reduced or prevented.

In an exemplary embodiment, the bending protection layer 460 may further include a protrusion portion, which will be described below, in the peripheral region 40 (e.g., the peripheral region 40 that is located adjacent to the bending region 50). A height from a lower surface of the bending protection layer 460 to the protrusion portion may be greater than a height of the polarizing layer 430, first height H1. For example, a height difference between the height from a lower surface of the bending protection layer 460 to the protrusion portion and the first height H1 may range between about 10 micrometers and about 30 micrometers. In an exemplary embodiment, the height difference may be larger than about 30 micrometers. When the bending protection layer 460 includes the protrusion portion, a contact area of the polarizing layer 430 and the bending protection layer 460 may increase. Accordingly, when the OLED device 100 is bent, the separation of the bending protection layer 460 from the polarizing layer 430 may be reduced. In an exemplary embodiment, the protrusion portion may support the touch screen electrode layer 410 such that the touch screen electrode layer 410 is not bent. In addition, when the upper adhesion layer 415 is spread as liquid state to bond the polarizing layer 430 and the touch screen electrode layer 410, the protrusion portion may prevent the upper adhesion layer 415 from flowing out into the bending protection layer 460.

The pad electrode 470 may be disposed in the pad electrode region 60 on the display panel 200. The pad electrode 470 may be electrically connected to an external device, and may provide a data signal, a scan signal, a light emission signal, a power supply voltage, etc., which are applied from the external device to the pixels P.

Figure 5:
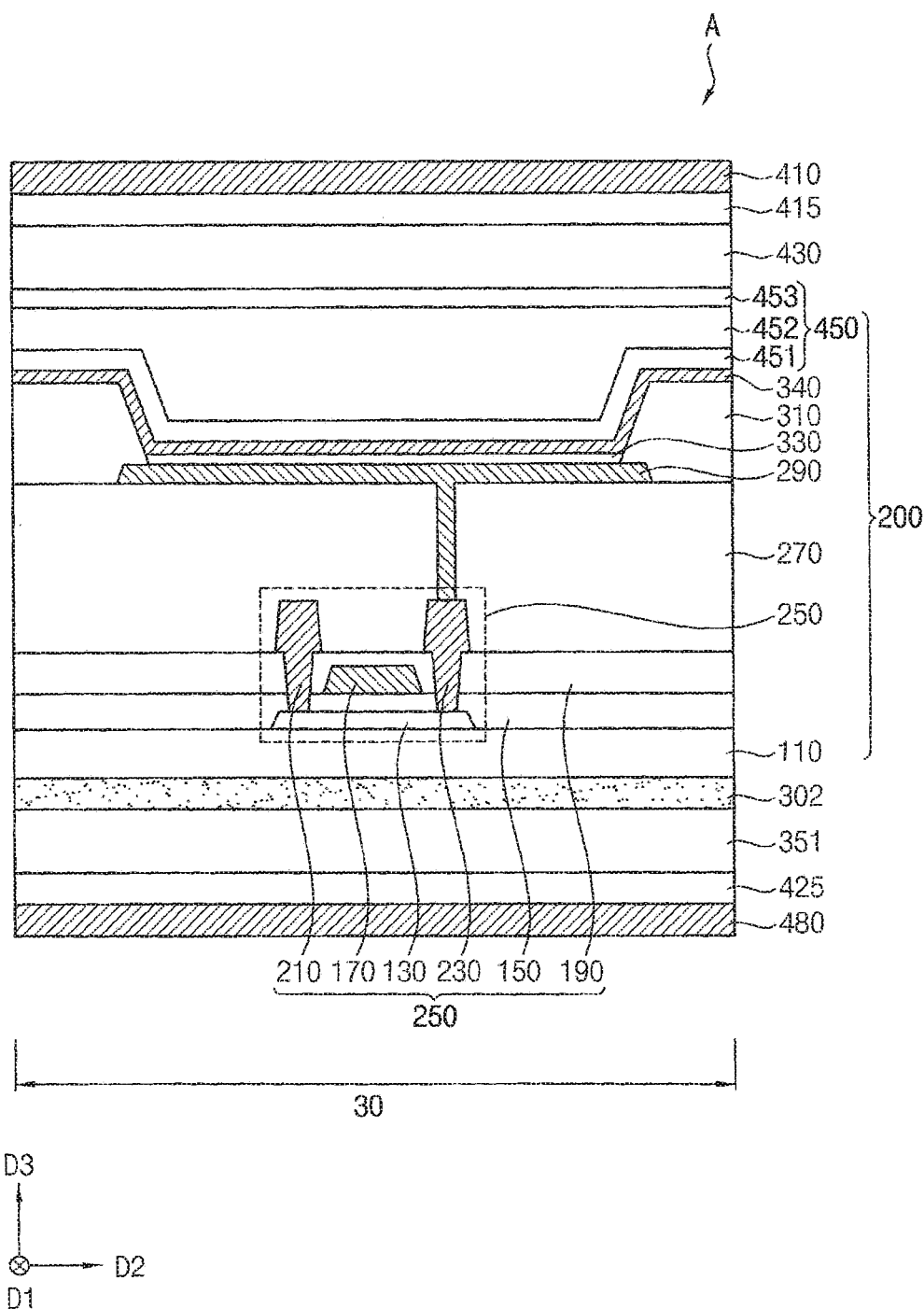
FIG. 5 is an enlarged cross-sectional view corresponding to region 'A' of FIG. 3.
Figure 6:
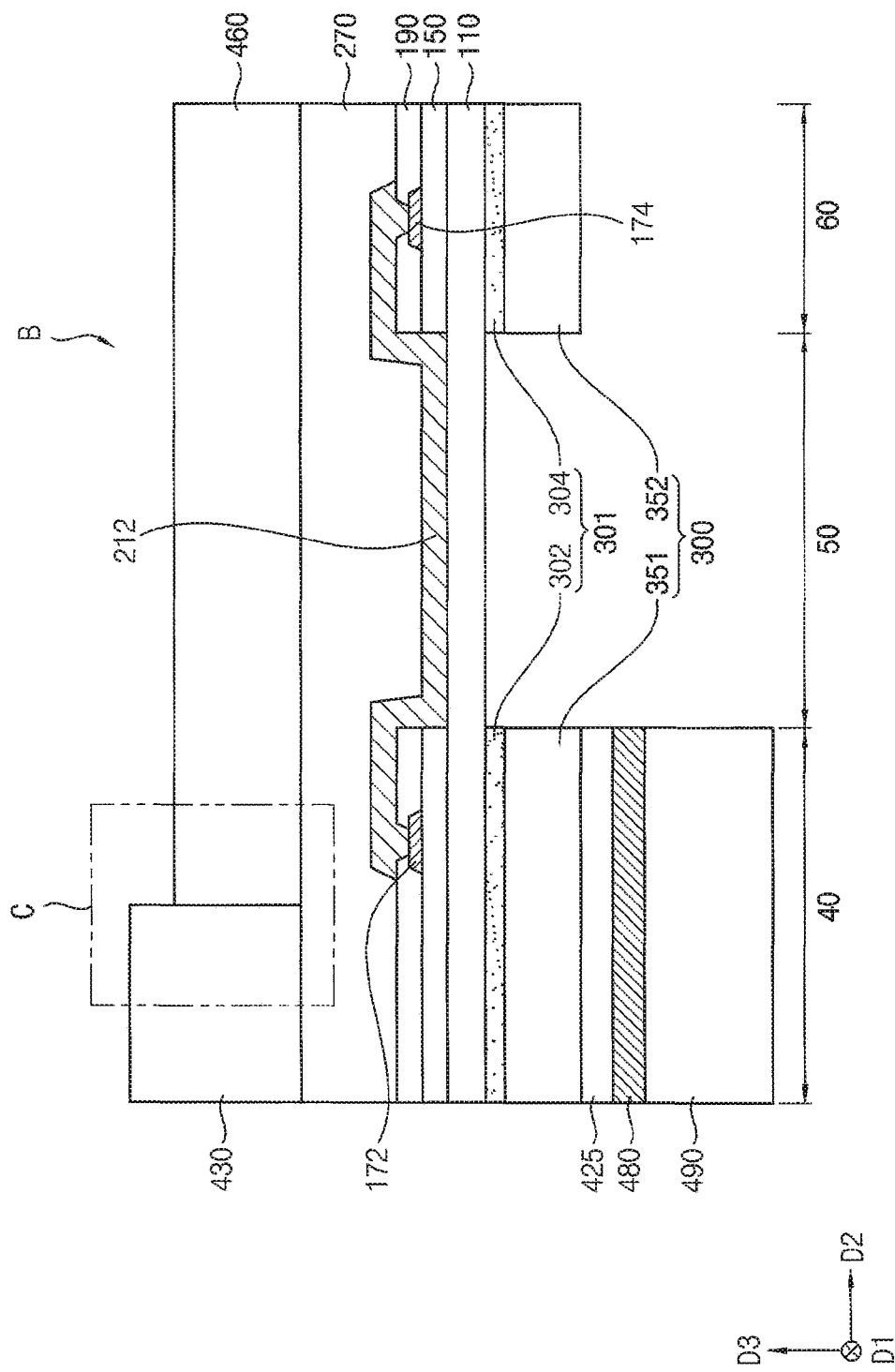
FIG. 6 is an enlarged cross-sectional view corresponding to region 'B' of FIG. 3.
Figure 7:
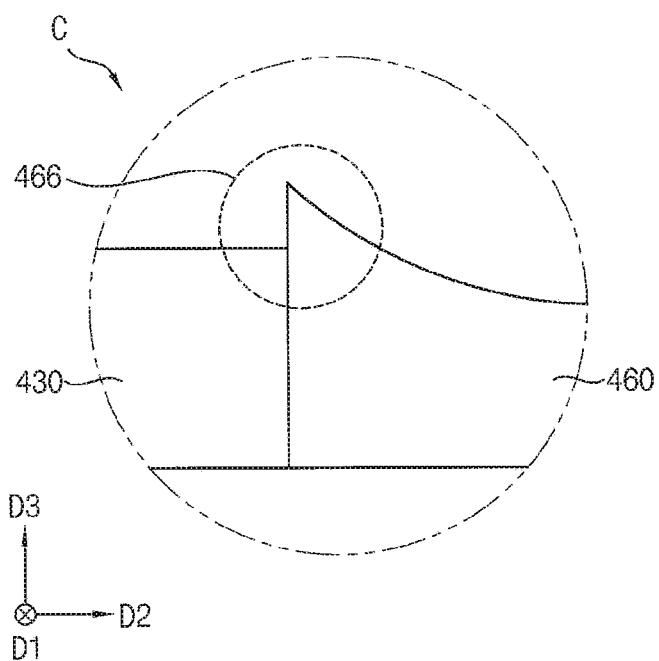
FIG. 7 is an enlarged cross-sectional view corresponding to region 'C' of FIG. 3.
Figure 8:
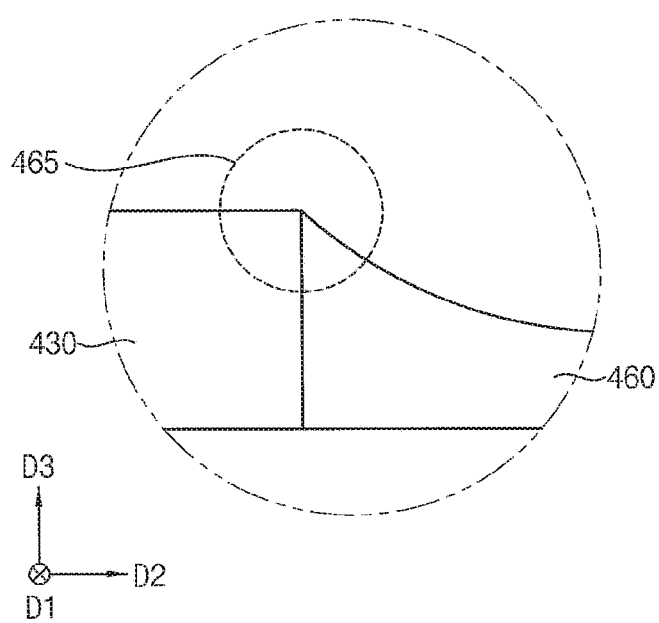
FIG. 8 and FIG. 9 are cross-sectional views illustrating an exemplary embodiment of a protrusion portion included in a bending protection layer of FIG. 7.
Figure 9:
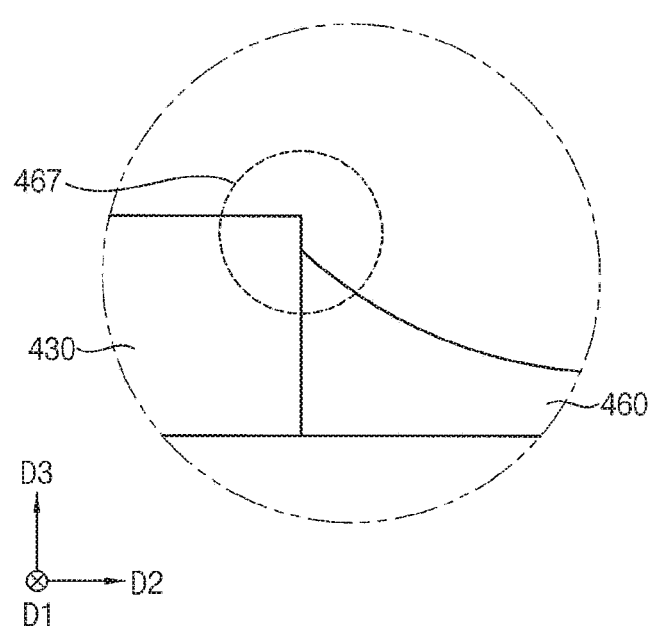

FIG. 5 is an enlarged cross-sectional view corresponding to region 'A' of FIG. 3, and FIG. 6 is an enlarged cross-sectional view corresponding to region 'B' of FIG. 3. FIG. 7 is an enlarged cross-sectional view corresponding to region 'C' of FIG. 3, and FIG. 8 and FIG. 9 are cross-sectional views illustrating an exemplary embodiment of a protrusion portion included in a bending protection layer of FIG. 7.

Referring to FIG. 5, FIG. 6, and FIG. 7, an OLED device 100 may include a display panel 200, a first lower adhesion layer 301, a lower protection film 300, a second lower adhesion layer 425, a heat sink plate 480, a third lower adhesion layer 490, a polarizing layer 430, an upper adhesion layer 415, a touch screen electrode layer 410, a bending protection layer 460, a pad electrode 470, etc. Here, the display panel 200 may include a substrate 110, a semiconductor element 250, a connection electrode 212, a first conductive pattern 172, a second conductive pattern 174, a planarization layer 270, a pixel defining layer 310, a lower electrode 290, a light emitting layer 330, an upper electrode 340, and a thin film encapsulation (TFE) structure 450. In addition, the semiconductor element 250 may include an active layer 130, a gate insulation layer 150, a first gate electrode 170, a first insulating interlayer 190, a source electrode 210, and drain electrode 230, and the TFE structure 450 may include a first TFE layer 451, a second TFE layer 452, and a third TFE layer 453. Further, the first lower adhesion layer 301 may include a first lower adhesion layer pattern 302 and a second lower adhesion layer pattern 304, and the lower protection film 300 may include a first lower protection film pattern 351 and a second lower protection film pattern 352.

When the OLED device 100 includes the flexible substrate 110 and the TFE structure 450, the OLED device 100 may serve as a flexible OLED device.

In an exemplary OLED device, a substrate 110 may be provided. The substrate 110 may include transparent materials or opaque materials. The substrate 110 may include, for example, a flexible transparent material such as a flexible transparent resin substrate (e.g., a polyimide substrate). For example, the polyimide substrate may include a first polyimide layer, a first barrier film layer, a second polyimide layer, a second barrier film layer, etc. Since the polyimide substrate is relatively thin and flexible, the polyimide substrate may be disposed on a rigid glass substrate to help support the formation of the semiconductor element 250 and the light emitting structure (e.g., the lower electrode 290, the light emitting layer 330, the upper electrode 340, etc). For example, the substrate 110 may have a structure in which the first polyimide layer, the first barrier film layer, the second polyimide layer, and the second barrier film layer are stacked on the rigid glass substrate. When manufacturing the OLED device 100, after an insulating layer (e.g., a buffer layer) is provided on the second barrier layer of the polyimide substrate, the semiconductor element 250 and the light emitting structure may be disposed on the insulating layer. After the semiconductor element 250 and the light emitting structure are formed on the insulating layer, the rigid glass substrate on which the polyimide substrate is disposed may be removed. It may be relatively difficult to directly form the semiconductor element 250 and the light emitting structure on the polyimide substrate because the polyimide substrate is relatively thin and flexible. Accordingly, the semiconductor element 250 and the light emitting structure may be formed on the polyimide substrate and the rigid glass substrate, and then the polyimide substrate may serve as the substrate 110 of the OLED device 100 after removing the rigid glass substrate. In exemplary embodiments, the substrate 110 may include, for example, a quartz substrate, a synthetic quartz substrate, a calcium fluoride substrate, a fluoride-doped quartz substrate, a soda lime glass substrate, a non-alkali glass substrate, etc.

A buffer layer (not shown) may be disposed on the substrate 110. The buffer layer may be disposed on the entire substrate 110. The buffer layer may prevent or reduce the diffusion of metal atoms and/or impurities from the substrate 110 into the semiconductor element 250. Additionally, the buffer layer may control a rate of a heat transfer in a crystallization process for forming the active layer 130, to obtain a substantially uniform active layer 130. Furthermore, the buffer layer may improve a surface flatness of the substrate 110 when the surface of the substrate 110 is relatively irregular. According to a type of the substrate 110, for example, at least two buffer layers may be provided on the substrate 110, or the buffer layer may not be disposed. But aspects of the inventive concepts are not limited thereto. The buffer layer may include, for example, silicon compound, metal oxide, etc.

The semiconductor element 250 may be disposed on the substrate 110. The active layer 130 may be disposed on the substrate 110. The active layer 130 may include, for example, an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130, and may be disposed on the substrate 110. For example, the gate insulation layer 150 may sufficiently cover the active layer 130 on the substrate 110, and may have a substantially level surface without a step around the active layer 130. In an exemplary embodiment, the gate insulation layer 150 may cover the active layer 130 on the substrate 110, and may be disposed in a substantially uniform thickness along a profile of the active layer 130. In an exemplary embodiment, the gate insulation layer 150 may expose an upper surface of the substrate 110 that is located in a portion of the peripheral region 40, the bending region 50, and a portion of the pad electrode region 60. The gate insulation layer 150 may include, for example, silicon compound, metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The gate electrode 170 may be disposed on a portion of the gate insulation layer 150 under which the active layer 130 is located. The gate electrode 170 may include, for example, a metal, a metal alloy, metal nitride, conductive metal oxide, transparent conductive materials, etc. For example, the gate electrode 170 may include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These examples may be used alone or in a combination thereof. In an exemplary embodiment, the gate electrode 170 may have a multi-layered structure.

The insulating interlayer 190 may be disposed on the gate electrode 170. The insulating interlayer 190 may cover the gate electrode 170, and may be disposed on the gate insulation layer 150. For example, the insulating interlayer 190 may sufficiently cover the gate electrode 170 on the gate insulation layer 150, and may have a substantially level surface without a step around the gate electrode 170. In an exemplary embodiment, the insulating interlayer 190 may cover the gate electrode 170 on the gate insulation layer 150, and may be disposed in a substantially uniform thickness along a profile of the gate electrode 170. In an exemplary embodiment, the insulating interlayer 190 may expose an upper surface of the substrate 110 that is located in a portion of the peripheral region 40, the bending region 50, and a portion of the pad electrode region 60. The insulating interlayer 190 may include, for example, a silicon compound, a metal oxide, etc.

The source electrode 210 and the drain electrode 230 may be disposed on the insulating interlayer 190. The source electrode 210 may be in direct contact with a first side of the active layer 130 via a contact hole formed by removing a portion of the gate insulation layer 150 and the insulating interlayer 190. The drain electrode 230 may be in direct contact with a second side of the active layer 130 via a contact hole formed by removing another portion of the gate insulation layer 150 and the insulating interlayer 190. Each of the source electrode 210 and the drain electrode 230 may include, for example, a metal, an alloy, metal nitride, conductive metal oxide, transparent conductive materials, etc. These examples may be used alone or in a combination thereof. In an exemplary embodiment, each of the source and drain electrodes 210 and 230 may have a multi-layered structure. Accordingly, the semiconductor element 250 including the active layer 130, the gate insulation layer 150, the gate electrode 170, the insulating interlayer 190, the source electrode 210, and the drain electrode 230 may be disposed.

In an exemplary embodiment, the semiconductor element 250 may have a top gate structure, but is not limited thereto. For example, in an exemplary embodiment, the semiconductor element 250 may have a bottom gate structure.

As illustrated in FIG. 6, the first conductive pattern 172 may be disposed in the peripheral region 40 on the gate insulation layer 150. As described above, the first conductive pattern 172 may be one among a plurality of the wirings. For example, the first conductive pattern 172 may include a data signal wiring, a scan signal wiring, a light emission signal wiring, a power supply wiring, etc.

The second conductive pattern 174 may be disposed in the pad electrode region 60 on the gate insulation layer 150. The second conductive pattern 174 may be electrically connected to the pad electrode 470.

The connection electrode 212 may be disposed in a portion of the peripheral region 40, the bending region 50, and the a portion of the pad electrode region 60 on the insulating interlayer 190 to overlap the first conductive pattern 172 and the second conductive pattern 174. The connection electrode 212 may be in contact with the first conductive pattern 172 via a contact hole formed by removing a portion of the insulating interlayer 190 located in the peripheral region 40, and may be in contact with the second conductive pattern 174 via a contact hole formed by removing a portion of the insulating interlayer 190 located in the pad electrode region 60. In an exemplary embodiment, the first conductive pattern 172, the second conductive pattern 174, and the gate electrode 170 may be simultaneously (or concurrently) formed using the same material. In addition, the connection electrode 212, the source electrode 210, and the drain electrode 230 may be simultaneously formed using the same material. But aspects of the inventive concepts are not limited thereto.

In an exemplary embodiment, an external device may be electrically connected to the pad electrode 470, and the external device may provide a data signal, a scan signal, a light emission signal, a power supply voltage, etc. to the pixels through the second conductive pattern 174, the connection electrode 212, and the first conductive pattern 172.

Referring again to FIG. 5 and FIG. 6, the planarization layer 270 may be disposed on the connection electrode 212, the source electrode 210, and the drain electrode 230. The planarization layer 270 may cover the connection electrode 212, the source electrode 210, and the drain electrode 230, and may be disposed on the entire insulating interlayer 190. In an exemplary embodiment, the planarization layer 270 may be disposed with a thickness to sufficiently cover the connection electrode 212 and the source electrode 210 and the drain electrode 230. For example, the planarization layer 270 may have a substantially flat upper surface, and a planarization process may be further performed on the planarization layer 270 to implement the flat upper surface of the planarization layer 270. In an exemplary embodiment, the planarization layer 270 may cover the connection electrode 212 and the source electrode 210 and the drain electrode 230, and may be disposed as a substantially uniform thickness along a profile of the connection electrode 212 and the source electrode 210 and the drain electrode 230. The planarization layer 270 may include organic materials or inorganic materials.

As illustrated in FIG. 5, the lower electrode 290 may be disposed on the planarization layer 270. The lower electrode 290 may be in contact with the drain electrode 230 via a contact hole formed by removing a portion of the planarization layer 270. In addition, the lower electrode 290 may be electrically connected to the semiconductor element 250. The lower electrode 290 may include, for example, a metal, a metal alloy, metal nitride, conductive metal oxide, transparent conductive materials, etc. These examples may be used alone or in a combination thereof. In an exemplary embodiment, the lower electrode 290 may have a multi-layered structure.

The pixel defining layer 310 may be disposed on the planarization layer 270, and may expose a portion of the lower electrode 290. For example, the light emitting layer 330 may be disposed on the portion of the lower electrode 290 exposed by the pixel defining layer 310. In an exemplary embodiment, the pixel defining layer 310 may expose the bending region 50 and the pad electrode region 60. The pixel defining layer 310 may include organic materials or inorganic materials.

The light emitting layer 330 may be disposed in a portion where the lower electrode 290 is exposed. The light emitting layer 330 may be formed using at least one of light emitting materials capable of generating different colors of light (e.g., a red color of light, a blue color of light, and a green color of light, etc.) according to sub-pixels. In an exemplary embodiment, the light emitting layer 330 may generally generate a white color light by stacking a plurality of light emitting materials capable of generating different colors of light such as red color light, green color light, blue color light, etc. For example, a color filter may be disposed on the light emitting layer 330. The color filter may include at least one of a red color filter, a green color filter, and a blue color filter. In an exemplary embodiment, the color filter may include a yellow color filter, a cyan color filter, and a magenta color filter, but is not limited thereto. The color filter may include a photosensitive resin, a color photoresist, etc.

The upper electrode 340 may be disposed on the pixel defining layer 310 and the light emitting layer 330. The upper electrode 340 may include, for example, a metal, a metal alloy, metal nitride, conductive metal oxide, transparent conductive materials, etc. These examples may be used alone or in a combination thereof. In an exemplary embodiment, the upper electrode 340 may have a multi-layered structure.

The TFE structure 450 may be disposed on the upper electrode 340. The TFE structure 450 may include the first TFE layer 451, the second TFE layer 452, and the third TFE layer 453. For example, the second TFE layer 452 may be disposed on the first TFE layer 451, and the third TFE layer 453 may be disposed on the second TFE layer 452. The first TFE layer 451 may be disposed on the upper electrode 340. The first TFE layer 451 may cover the upper electrode 340, and may be disposed in a substantially uniform thickness along a profile of the upper electrode 340. The first TFE layer 451 may reduce or prevent the light emitting structure from being deteriorated by the permeation of moisture, water, oxygen, etc. In addition, the first TFE layer 451 may protect the light emitting structure from external impacts. The first TFE layer 451 may include inorganic materials.

The second TFE layer 452 may be disposed on the first TFE layer 451. The second TFE layer 452 may improve the flatness of the OLED device 100, and may protect the light emitting structure. The second TFE layer 452 may include organic materials.

The third TFE layer 453 may be disposed on the second TFE layer 452. The third TFE layer 453 may cover the second TFE layer 452, and may be disposed in a substantially uniform thickness along a profile of the second TFE layer 452. The third TFE layer 453 together with the first TFE layer 451 and the second TFE layer 452 may reduce or prevent the light emitting structure from being deteriorated by the permeation of moisture, water, oxygen, etc. In addition, the third TFE layer 453 together with the first TFE layer 451 and the second TFE layer 452 may protect the light emitting structure from external impacts. The third TFE layer 453 may include inorganic materials. Accordingly, the TFE structure 450 including the first TFE layer 451, the second TFE layer 452, and the third TFE layer 453 may be disposed. In addition, the display panel 200 including the substrate 110, the semiconductor element 250, the planarization layer 270, the lower electrode 290, the pixel defining layer 310, the light emitting layer 330, the upper electrode 340, and the TFE structure 450 may be disposed.

In an exemplary embodiment, the TFE structure 450 may have a five layer structure where first to fifth TFE layers are stacked or a seven layer structure where the first to seventh TFE layers are stacked, but is not limited thereto.

The first lower adhesion layer 301 may be disposed on a lower surface on the substrate 110. The first lower adhesion layer 301 may be in contact with a lower surface of the display panel 200. The first lower adhesion layer 301 may bond the lower protection film 300 and the display panel 200. The first lower adhesion layer 301 may include the first lower adhesion layer pattern 302 and the second lower adhesion layer pattern 304. The first lower adhesion layer pattern 302 may be disposed in the entire display region 10, and the second lower adhesion layer pattern 304 may be disposed only in the pad electrode region 60 such that a lower surface of the display panel 200 that is located in the bending region 50 is exposed. The first lower adhesion layer 301 may expose a lower surface of the display panel 200 in the bending region 50, and the first lower adhesion layer pattern 302 and the second lower adhesion layer pattern 304 may be spaced apart from each other. The first lower adhesion layer 301 may include optical clear adhesives (OCA), pressure sensitive adhesives (PSA), etc. such as acryl-based adhesives, silicon-based adhesives, urethane-based adhesives, rubber-based adhesives, vinyl ether-based adhesives, etc.

The lower protection film 300 may be disposed on a lower surface of the first lower adhesion layer 301. The lower protection film 300 may protect the display panel 200 from external impacts. The lower protection film 300 may include the first lower protection film pattern 351 and the second lower protection film pattern 352. The first lower protection film pattern 351 may be disposed in the entire display region 10, and the second lower protection film pattern 352 may be disposed only in the pad electrode region 60 such that a lower surface of the display panel 200 that is located in the bending region 50 is exposed. The lower protection film 300 may expose a lower surface of the display panel 200 in the bending region 50, and the first lower protection film pattern 351 and the second lower protection film pattern 352 may be spaced apart from each other. In addition, the first lower protection film pattern 351 may overlap the first lower adhesion layer pattern 302, and the second lower protection film pattern 352 may overlap the second lower adhesion layer pattern 304. The lower protection film 300 may include, for example, polyethylene terephthalate (PET), polyethylene naphthalate (PEN), polypropylene (PP), polycarbonate (PC), polystyrene (PS), polysulfone (PSul), polyethyene (PE), polyphthalamide (PPA), polyethersulfone (PES), polyarylate (PAR), polycarbonate oxide (PCO), modified polyphenylene oxide (MPPO), etc. A thickness of the lower protection film 300 may be about 150 micrometers, but is not limited thereto.

The second lower adhesion layer 425 may be disposed on a lower surface of first lower protection film pattern 351. The second lower adhesion layer 425 may be in contact with the lower surface of the first lower protection film pattern 351. The second lower adhesion layer 425 may bond the first lower protection film pattern 351 and the heat sink plate 480. The second lower adhesion layer 425 may include OCA, PSA, etc.

The heat sink plate 480 may be disposed on a lower surface of the second lower adhesion layer 425. The heat sink plate 480 may be in contact with the lower surface of the second lower adhesion layer 425. As the heat sink plate 480 is disposed on a lower surface of the display panel 200, a heat generated in the display panel 200 may be cooled. When the heat generated in the display panel 200 is not cooled, a performance of the pixels included in the display panel 200 may be reduced and a lifetime of the pixels may be decreased. The heat sink plate 480 may include a material that has relatively high heat conductivity. For example, the heat sink plate 480 may include, for example, Al, an alloy of Al, Ag, an alloy of Ag, W, Cu, an alloy of Cu, Ni, Cr, Mo, an alloy of Mo, Ti, Pt, Ta, Nd, Sc, etc. These examples may be used alone or in a combination thereof. A thickness of the heat sink plate 480 may be about 100 micrometers, but is not limited thereto.

The third lower adhesion layer 490 may be disposed on a lower surface of the heat sink plate 480. As the bending region 50 is bent, the pad electrode region 60 may be located on a lower surface of the OLED device 100. In an exemplary embodiment, the bending region 50 may be bent on an axis with respect to the first direction D1, and the second lower protection film pattern 352 may be disposed on a lower surface of the heat sink plate 480. When the bending region 50 is bent, the third lower adhesion layer 490 may be interposed between the second lower protection film pattern 352 and the heat sink plate 480. For example, the second lower protection film pattern 352 and the heat sink plate 480 may be fixed by the third lower adhesion layer 490. In addition, the third lower adhesion layer 490 may absorb external impacts. For example, the third lower adhesion layer 490 may include, for example, urethane, rubber, etc. A thickness of the third lower adhesion layer 490 may be equal to or greater than a thickness of the lower protection film 300, but is not limited thereto. For example, the thickness of the third lower adhesion layer 490 may be about 200 micrometers.

The polarizing layer 430 may be disposed on the TFE structure 450 (or the display panel 200). The polarizing layer 430 may be in contact with the TFE structure 450. In an exemplary embodiment, the polarizing layer 430 may have a first height H1. The first height H1 may range between about 60 micrometers and about 120 micrometers. For example, the first height H1 of the polarizing layer 430 may be about 100 micrometers. The polarizing layer 430 may include a linearly polarized film and a $\lambda/4$ phase retardation film. Here, the $\lambda/4$ phase retardation film may be disposed on the TFE structure 450. The $\lambda/4$ phase retardation film may convert a phase of the light. For example, the $\lambda/4$ phase retardation film may convert the light vibrating up and down or the light vibrating left and right into right-circularly polarized light or left-circularly polarized light, respectively. In addition, the $\lambda/4$ phase retardation film may convert the right-circularly polarized light or the left-circularly polarized light into the light vibrating up and down or the light vibrating left and right, respectively. The $\lambda/4$ phase retardation film may include, for example, a birefringent film containing polymer, an orientation film of a liquid crystal polymer, alignment layer of a liquid crystal polymer, etc.

The linearly polarized film may be disposed on the $\lambda/4$ phase retardation film. The linearly polarized film may selectively transmit the incident light. For example, the linearly polarized film may transmit the light vibrating up and down or vibrating left and right. For example, the linearly polarized film may include a pattern of horizontal stripes or vertical stripes. When the linearly polarized film includes a pattern of horizontal stripes, the linearly polarized film may block the light vibrating up and down, and may transmit the light vibrating left and right. When the linearly polarized film includes a pattern of vertical stripes, the linearly polarized film may block the light vibrating left and right, and may transmit the light vibrating up and down.

The light passing the linearly polarized film may pass the λ/4 phase retardation film. As described above, the λ/4 phase retardation film may convert a phase of the light. For example, when the incident light vibrating up, down, left, and right passes through the linearly polarized film, the linearly polarized film including a pattern of the horizontal stripes may transmit the light vibrating left and right. When the incident light vibrating left and right passes through the λ/4 phase retardation film, the incident light vibrating left and right may be converted into the left-circularly polarized light. The incident light including the left-circularly polarized light may be reflected from the upper electrode 340, and then the incident light may be converted into the right-circularly polarized light. When the incident light including the right-circularly polarized light passes through the λ/4 phase retardation film, the incident light may be converted into the light vibrating up and down. Here, the light vibrating up and down may be blocked by the linearly polarized film including a pattern of the horizontal stripes. Accordingly, the incident light may be removed by the linearly polarized film and the λ/4 phase retardation film (i.e., the polarizing layer 430). For example, the linearly polarized film may include iodine-based materials, materials containing dye, polyene-based materials, etc.

The upper adhesion layer 415 may be disposed on the polarizing layer 430. The upper adhesion layer 415 may be in contact with the polarizing layer 430. The upper adhesion layer 415 may bond the polarizing layer 430 and the touch screen electrode layer 410. The upper adhesion layer 415 may include OCA, PSA, etc.

The touch screen electrode layer 410 may be disposed on the upper adhesion layer 415. For example, the touch screen electrode layer 410 may include a bottom polyethylene terephthalate (PET) film, touch screen electrodes, and a top PET film, etc. The bottom PET film and the top PET film may protect the touch screen electrodes. For example, each of the top PET film and the bottom PET film may include, for example, PET, PEN, PP, PC, PS, PSul, PE, PPA, PES, PAR, PCO, MPPO, etc. The touch screen electrodes may substantially have a metal mesh structure. For example, the touch screen electrodes may include carbon nanotube (CNT), transparent conductive oxide (TCO), ITO, indium gallium zinc oxide (IGZO), ZnO, graphene, silver nanowire (AgNW), Cu, Cr, etc. In an exemplary embodiment, the touch screen electrodes may be disposed directly on the TFE structure 450. For example, the bottom PET film may not be disposed on the TFE structure 450.

As illustrated in FIG. 6, the bending protection layer 460 may be disposed in a portion of the peripheral region 40, the bending region 50, and a portion of the pad electrode region 60 on the display panel 200. The bending protection layer 460 may be in contact with the display panel 200 (e.g., the planarization layer 270). In an exemplary embodiment, the polarizing layer 430 may be in contact with the bending protection layer 460 in a portion (e.g., peripheral region 40) where the display region 10 and the bending region 50 are adjacent to each other. The bending protection layer 460 may have an upper surface that has a height which is less than a height of an upper surface of the polarizing layer 430 (e.g., the first height H1). For example, the bending protection layer 460 may have a second height H2, and the second height H2 may be less than the first height H1. The second height H2 may range between about 50 micrometers and about 110 micrometers. In addition, the bending protection layer 460 may have a Young's modulus that ranges between 0.1 GPa and 0.7 GPa. Further, the bending protection layer 460 may overlap the first lower protection film pattern 351 in the peripheral region 40. A distance of the portion where the bending protection layer 460 and the first lower protection film pattern 351 overlap may have an overlap distance 70. The overlap distance 70 may be less than or equal to about 350 micrometers, but is not limited thereto. The bending protection layer 460 having a relatively high Young's modulus may have the relatively reduced overlap distance 70. For example, when the OLED device including a conventional bending protection layer having a relatively reduced overlap distance 70 is bent, the conventional bending protection layer may be separated from the display panel 200 and the polarizing layer 430. In an exemplary embodiment, the bending protection layer 460 may have a relatively reduced overlap distance 70, and the bending protection layer 460 may not be separated from the display panel 200 and the polarizing layer 430 because the bending protection layer 460 has the relatively high Young's modulus. Accordingly, as the bending protection layer 460 has the relatively reduced overlap distance 70, a width of the peripheral region 40 may be reduced or an area of the light emitting region 30 may be relatively increased. In addition, since the OLED device 100 has the bending protection layer 460, damage to the touch screen electrode layer 410 and the FPCB may be reduced or prevented.

As illustrated in FIG. 7, the bending protection layer 460 may further include a protrusion portion 466 in the peripheral region 40 (e.g., the peripheral region 40 that is located adjacent to the bending region 50). A height from a lower surface of the bending protection layer 460 to the protrusion portion 466 may be greater than the first height H1 of the polarizing layer 430. For example, a height difference between the height from a lower surface of the bending protection layer 460 to the protrusion portion 466 and the first height H1 may range between about 10 micrometers and about 30 micrometers. In an exemplary embodiment, the height difference may be more than about 30 micrometers. When the bending protection layer 460 includes the protrusion portion 466, a contact area of the polarizing layer 430 and the bending protection layer 460 may be increased. Accordingly, when the OLED device 100 is bent, separation between the bending protection layer 460 from the polarizing layer 430 may be reduced. In an exemplary embodiment, the protrusion portion 466 may support the touch screen electrode layer 410 such that the touch screen electrode layer 410 may not be bent. In addition, when the upper adhesion layer 415 is spread as liquid state to bond the polarizing layer 430 and the touch screen electrode layer 410, the protrusion portion 466 may prevent the upper adhesion layer 415 from flowing out into the bending protection layer 460.

The bending protection layer 460 may protect the connection electrode 212, and may raise a neutral plane of the bending region 50 in a third direction that is vertical to the first and second directions D1 and D2. For example, when the bending region 50 is bent, the connection electrodes may not be broken because the neutral plane of the bending region 50 is located within a portion where the connection electrodes are disposed. The bending protection layer 460 may include organic materials such as, for example, polyimide, epoxy-based resin, acryl-based resin, polyester, photoresist, polyacryl-based resin, polyimide-based resin, a polyamide-based resin, a siloxane-based resin, etc, and may include elastic materials such as, for example, silicon, urethane, thermoplastic poly urethane (TPU), etc.

Referring to FIG. 8 and FIG. 9, in exemplary embodiments, a height from a lower surface of the bending protection layer 460 to the protrusion portion 465 may be equal to the first height H1 of the polarizing layer 430, and a height from a lower surface of the bending protection layer 460 to the protrusion portion 467 may be less than the first height H1 of the polarizing layer 430.

As the OLED device 100 in accordance with exemplary embodiments includes the bending protection layer 460 having a relatively thin thickness, the OLED device 100 may prevent the touch screen electrode layer 410 and the FPCB of the touch screen electrode layer 410 from being damaged by the bending protection layer 460. In addition, as the bending protection layer 460 includes the protrusion portion 466, the bending protection layer 460 may not be separated from the polarizing layer 430 when the OLED device 100 is bent because a contact area of the polarizing layer 430 and the bending protection layer 460 is relatively increased.

Figure 10:
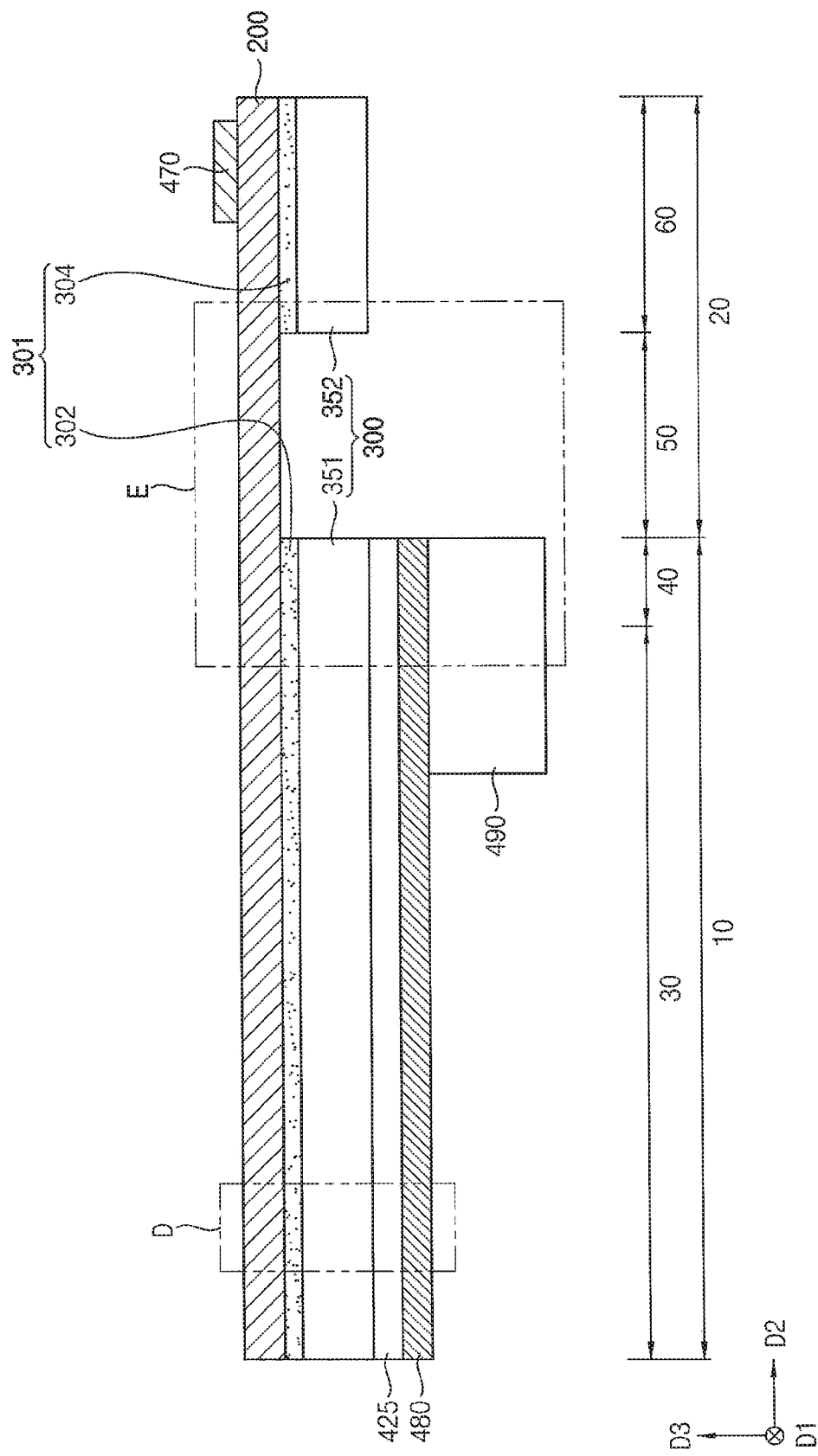
FIG. 10, FIG. 11, FIG. 12, FIG. 13, FIG. 14, FIG. 15, FIG. 16, FIG. 17, FIG. 18, FIG. 19, and FIG. 20 are cross-sectional views illustrating a method of manufacturing an OLED device in accordance with exemplary embodiments.
Figure 11:
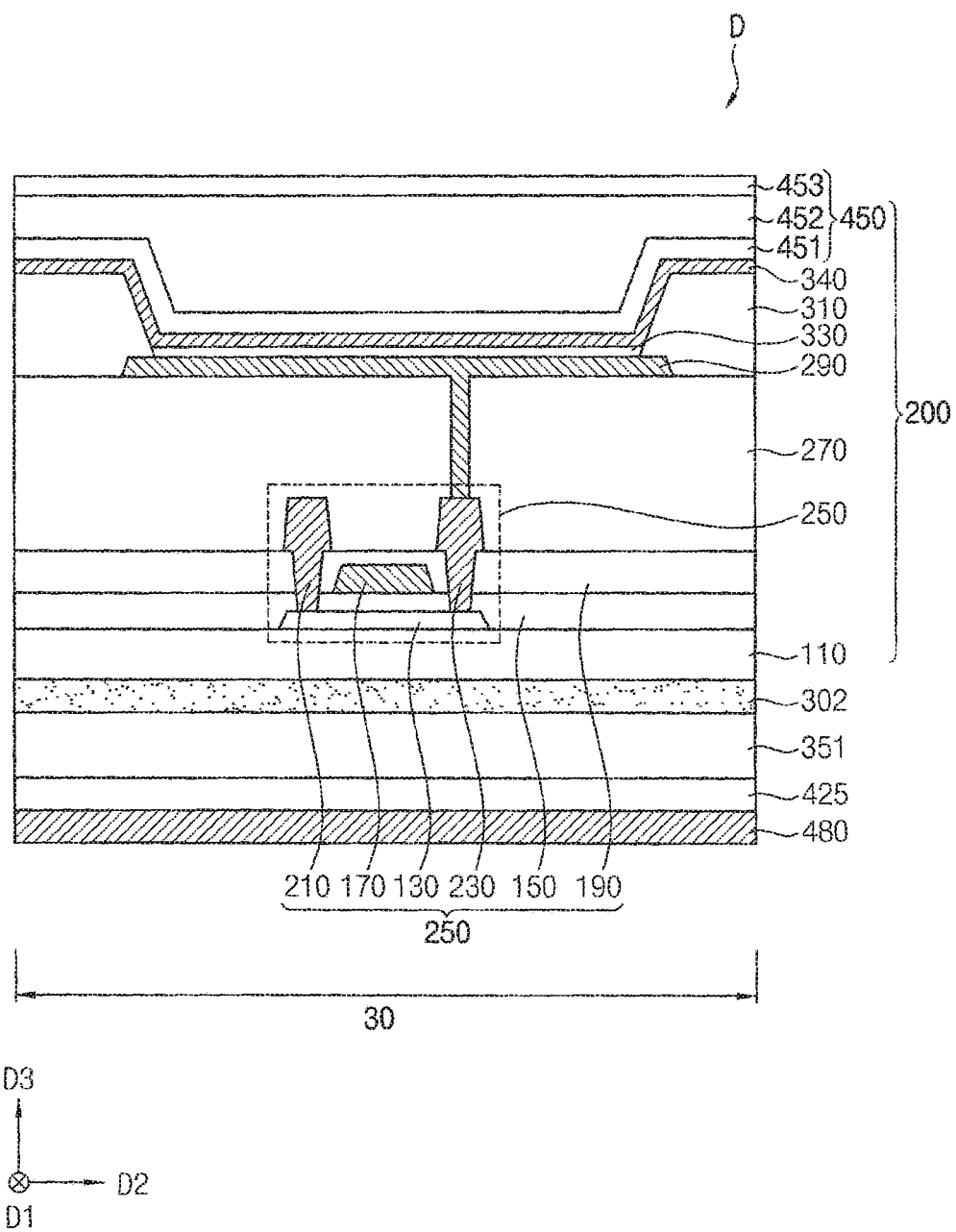
Figure 12:
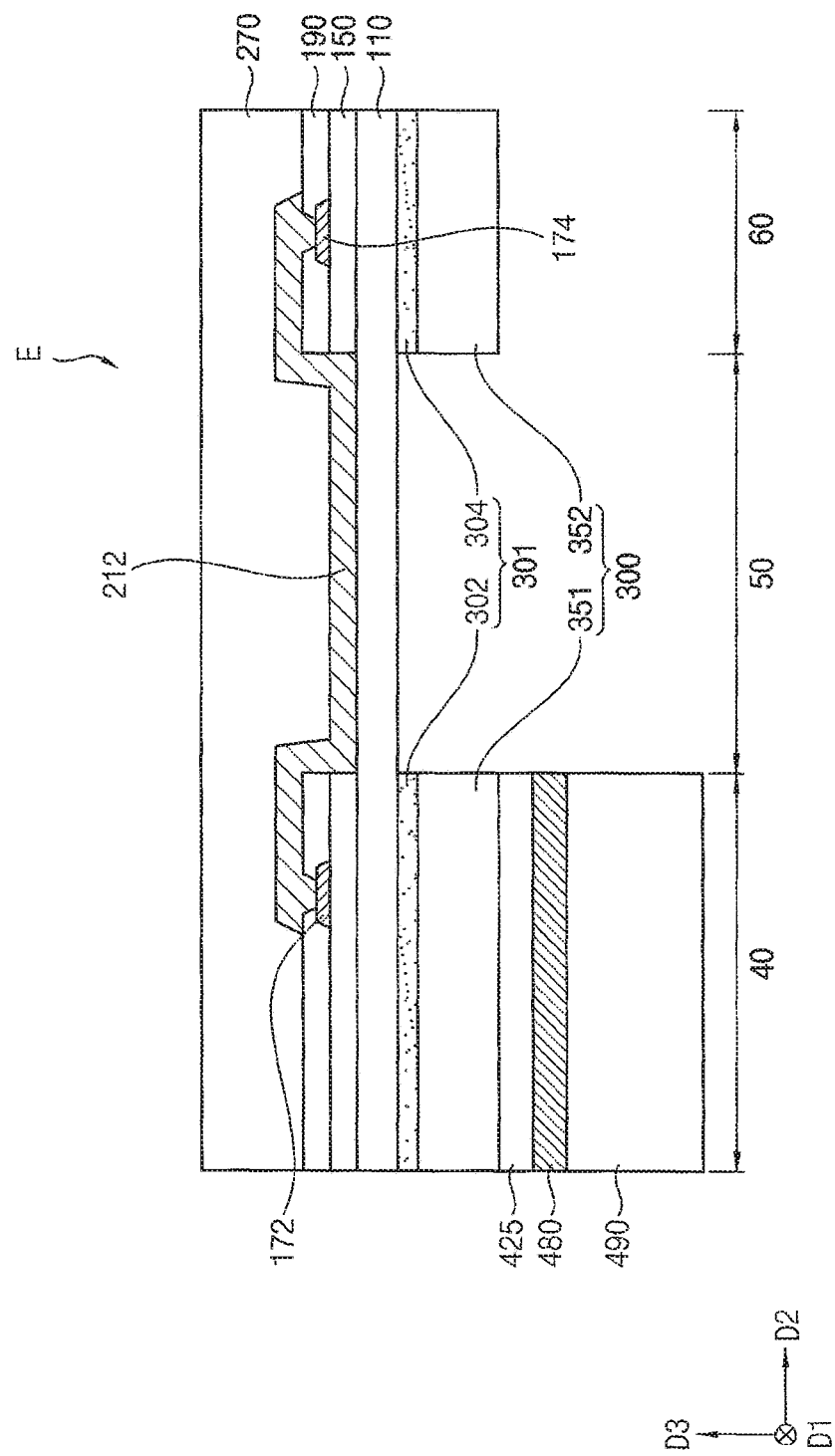
Figure 13:
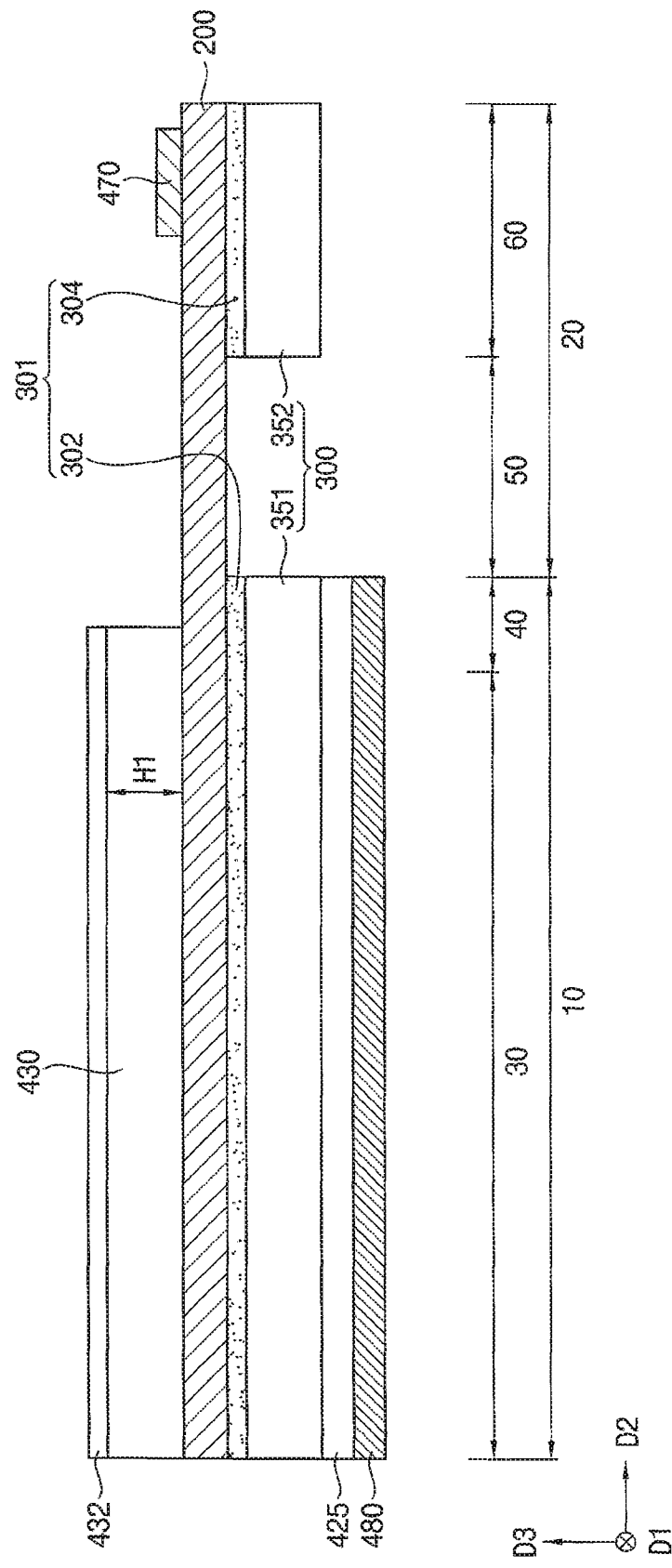
Figure 14:
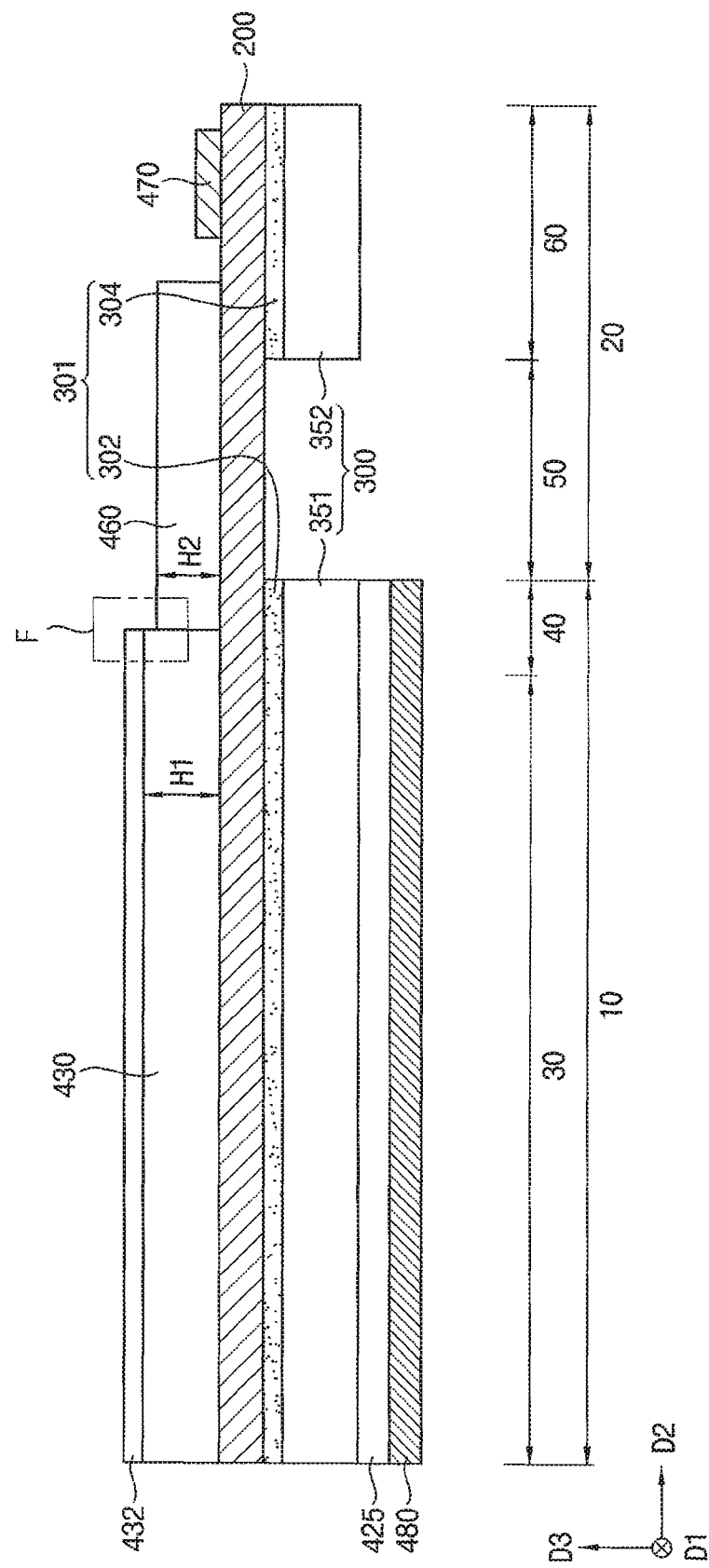
Figure 15:
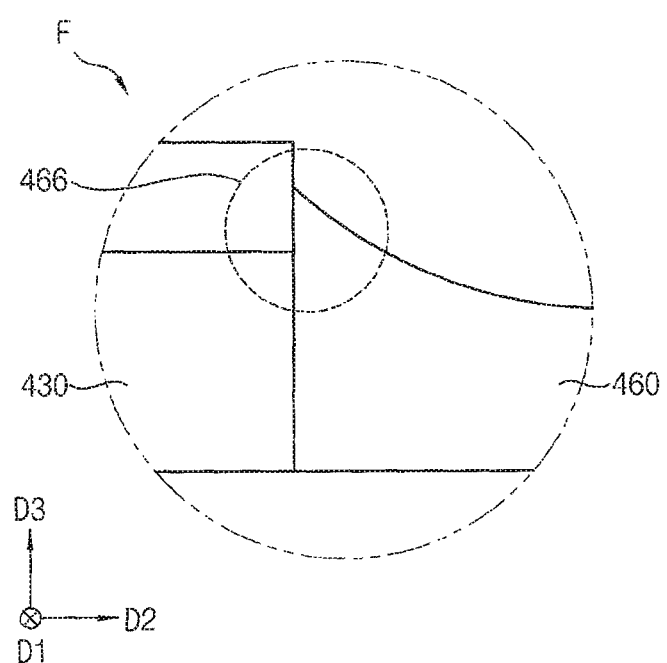
Figure 16:
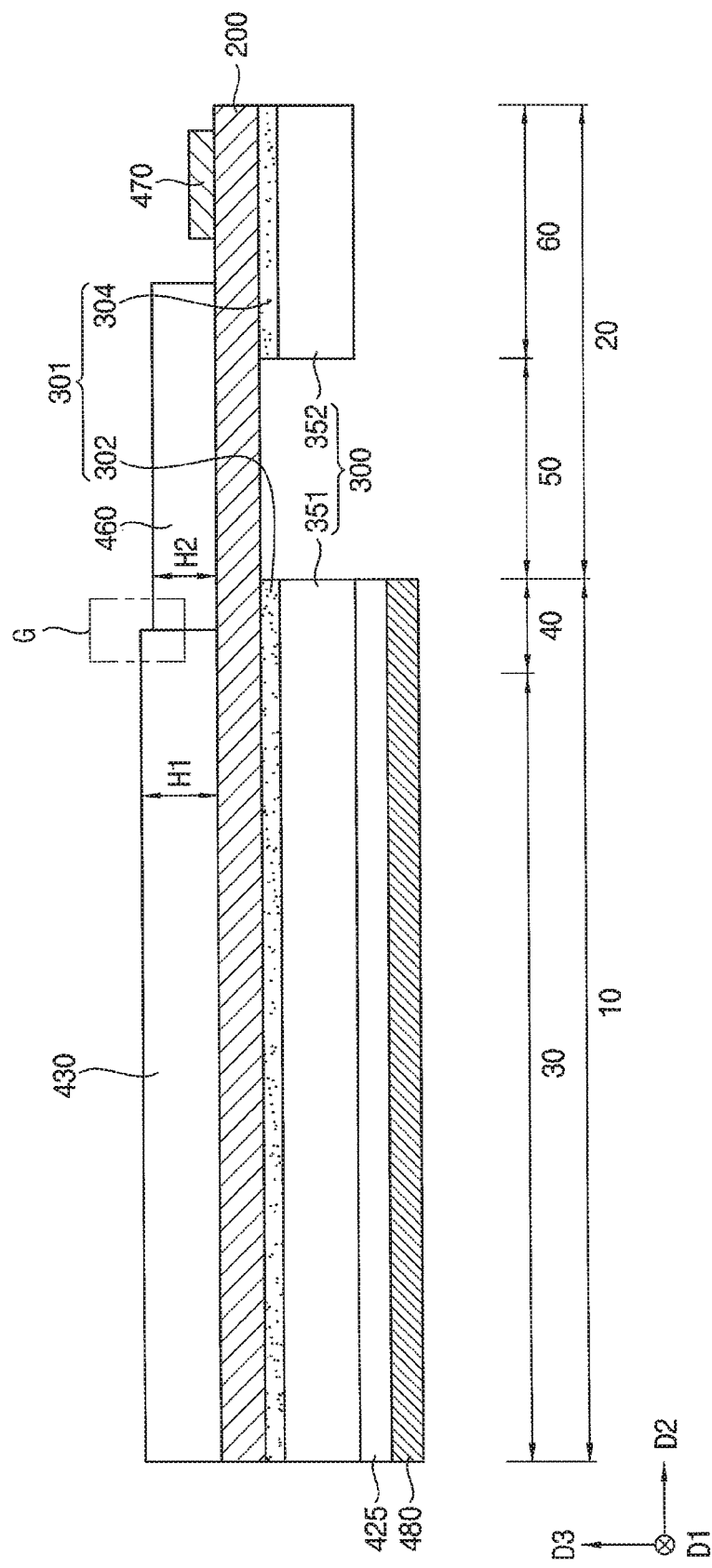
Figure 17:
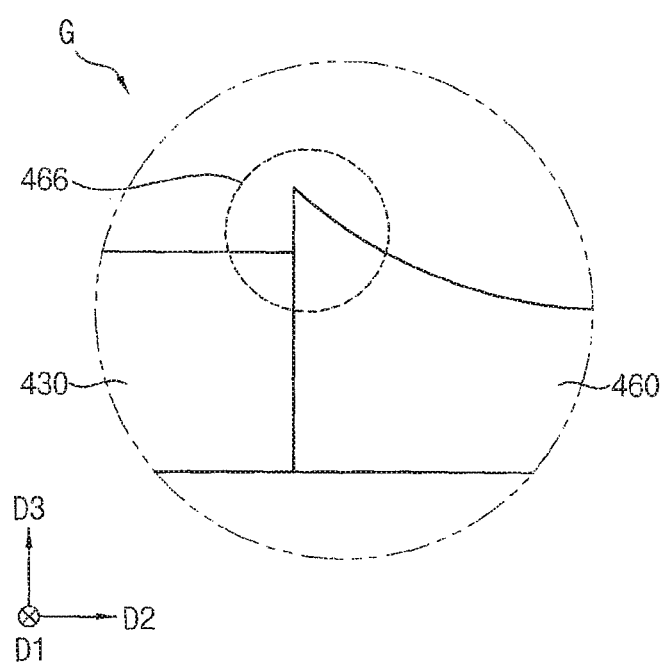

FIG. 10, FIG. 11, FIG. 12, FIG. 13, FIG. 14, FIG. 15, FIG. 16, FIG. 17, FIG. 18, FIG. 19, and FIG. 20 are cross-sectional views illustrating a method of manufacturing an OLED device in accordance with exemplary embodiments. For example, FIG. 11 is an enlarged cross-sectional view corresponding to region 'D' of FIG. 10, and FIG. 12 is an enlarged cross-sectional view corresponding to region 'E' of FIG. 10. In addition, FIG. 15 is an enlarged cross-sectional view corresponding to region 'F' of FIG. 14, and FIG. 17 is an enlarged cross-sectional view corresponding to region 'G' of FIG. 16.

Referring to FIG. 10, FIG. 11, and FIG. 12, a display panel 200, a first lower adhesion layer 301, a lower protection film 300, a second lower adhesion layer 425, and a heat sink plate 480 that are formed on a lower surface of the display panel 200, and a pad electrode 470 that is formed in the pad electrode region 60 on the display panel 200 may be provided.

For example, as illustrated in FIG. 11 and FIG. 12, a substrate 110 may be formed on a rigid glass substrate. The substrate 110 may be formed using a flexible transparent material such as a flexible transparent resin substrate.

A buffer layer (not shown) may be formed on the substrate 110. The buffer layer may be formed on the entire substrate 110. The buffer layer may reduce or prevent the diffusion of metal atoms and/or impurities from the substrate 110 into a semiconductor element. Additionally, the buffer layer may control a rate of a heat transfer in a crystallization process for forming an active layer, thereby obtaining substantially uniform the active layer. Furthermore, the buffer layer may improve a surface flatness of the substrate 110 when a surface of the substrate 110 is relatively irregular. The buffer layer may be formed using, for example, silicon compound, metal oxide, etc.

An active layer 130 may be formed on the substrate 110, and the active layer 130 may be formed using, for example, an oxide semiconductor, an inorganic semiconductor, an organic semiconductor, etc.

A gate insulation layer 150 may be formed on the active layer 130. The gate insulation layer 150 may cover the active layer 130, and may be formed on the substrate 110. In addition, the gate insulation layer 150 may expose an upper surface of the substrate 110 that is located in a bending region 50. The gate insulation layer 150 may be formed using, for example, silicon compound, metal oxide, etc.

A gate electrode 170 may be formed on a portion of the gate insulation layer 150 under which the active layer 130 is located. The gate electrode 170 may be formed using, for example, a metal, a metal alloy, metal nitride, conductive metal oxide, transparent conductive materials, etc.

A first conductive pattern 172 may be formed in a peripheral region 40 on the gate insulation layer 150. For example, the first conductive pattern 172 may include a data signal wiring, a scan signal wiring, a light emission signal, wiring a power supply wiring, etc. A second conductive pattern 174 may be formed in the pad electrode region 60 on the gate insulation layer 150. The second conductive pattern 174 may be electrically connected to a pad electrode 470. The first conductive pattern 172, the second conductive pattern 174, and the gate electrode 170 may be simultaneously formed using the same material.

An insulating interlayer 190 may be formed on the gate electrode 170, the first conductive pattern 172 and the second conductive pattern 174. The insulating interlayer 190 may cover the gate electrode 170, the first conductive pattern 172 and the second conductive pattern 174, and may be formed on the gate insulation layer 150. In addition, the insulating interlayer 190 may expose an upper surface of the substrate 110 that is located in the bending region 50. The insulating interlayer 190 may be formed using, for example, a silicon compound, a metal oxide, etc.

A source electrode 210 and a drain electrode 230 may be formed on the insulating interlayer 190. The source electrode 210 may be in direct contact with a first side of the active layer 130 via a contact hole formed by removing a portion of the gate insulation layer 150 and the insulating interlayer 190. The drain electrode 230 may be in direct contact with a second side of the active layer 130 via a contact hole formed by removing another portion of the gate insulation layer 150 and the insulating interlayer 190. The source electrode 210 and the drain electrode 230 may be formed using, for example, a metal, an alloy, metal nitride, conductive metal oxide, transparent conductive materials, etc. These examples may be used alone or in a combination thereof. In an exemplary embodiment, each of the source electrode 210 and the drain electrode 230 may have a multi-layered structure. Accordingly, a semiconductor element 250 including the active layer 130, the gate insulation layer 150, the gate electrode 170, the insulating interlayer 190, the source electrode 210, and the drain electrode 230 may be formed.

A connection electrode 212 may be formed in a portion of the peripheral region 40, the bending region 50, and the a portion of the pad electrode region 60 on the insulating interlayer 190 to overlap the first conductive pattern 172 and the second conductive pattern 174. The connection electrode 212 may be in contact with the first conductive pattern 172 via a contact hole formed by removing a portion of the insulating interlayer 190 located in the peripheral region 40, and may be in contact with the second conductive pattern 174 via a contact hole formed by removing a portion of the insulating interlayer 190 located in the pad electrode region 60. The connection electrode 212, the source electrode 210, and the drain electrode 230 may be simultaneously formed using the same material.

A planarization layer 270 may be formed on the connection electrode 212, the source electrode 210, and the drain electrode 230. The planarization layer 270 may cover the connection electrode 212, the source electrode 210, and the drain electrode 230, and may be formed on the entire insulating interlayer 190. In an exemplary embodiment, the planarization layer 270 may be formed with a thickness to sufficiently cover the connection electrode 212 and the source electrode 210 and drain electrode 230. For example, the planarization layer 270 may have a substantially flat upper surface, and a planarization process may be further performed on the planarization layer 270 to implement the flat upper surface of the planarization layer 270. The planarization layer 270 may be formed using organic materials.

A lower electrode 290 may be formed on the planarization layer 270. The lower electrode 290 may be in contact with the drain electrode 230 via a contact hole formed by removing a portion of the planarization layer 270. The lower electrode 290 may be formed using, for example, a metal, a metal alloy, metal nitride, conductive metal oxide, transparent conductive materials, etc. These examples may be used alone or in a combination thereof. In an exemplary embodiment, the lower electrode 290 may have a multi-layered structure.

A pixel defining layer 310 may be formed on the planarization layer 270, and may expose a portion of the lower electrode 290. The pixel defining layer 310 may expose the bending region 50 and the pad electrode region 60. The pixel defining layer 310 may be formed using organic materials.

A light emitting layer 330 may be formed in a portion where the lower electrode 290 is exposed. The light emitting layer 330 may be formed using at least one of light emitting materials capable of generating different colors of light (e.g., a red color of light, a blue color of light, and a green color of light, etc.) according to sub-pixels. In an exemplary embodiment, the light emitting layer 330 may generally generate a white color light by stacking a plurality of light emitting materials capable of generating different colors of light such as a red color light, a green color light, a blue color light, etc. For example, a color filter may be formed on the light emitting layer 330. The color filter may include at least one of a red color filter, a green color filter, and a blue color filter. In an exemplary embodiment, the color filter may include a yellow color filter, a cyan color filter, and a magenta color filter, but is not limited thereto. The color filter may be formed using a photosensitive resin, color photoresist, etc.

An upper electrode 340 may be formed on the pixel defining layer 310 and the light emitting layer 330. The upper electrode 340 may be formed using, for example, a metal, a metal alloy, metal nitride, conductive metal oxide, transparent conductive materials, etc. These examples may be used alone or in a combination thereof. In an exemplary embodiment, the upper electrode 340 may have a multi-layered structure.

A first TFE layer 451 may be formed on the upper electrode 340. The first TFE layer 451 may cover the upper electrode 340, and may be formed in a substantially uniform thickness along a profile of the upper electrode 340. The first TFE layer 451 may reduce or prevent a light emitting structure (e.g., the semiconductor element 250, the lower electrode 290, the light emitting layer 330, the upper electrode 340, etc) from being deteriorated by the permeation of moisture, water, oxygen, etc. In addition, the first TFE layer 451 may protect the light emitting structure from external impacts. The first TFE layer 451 may be formed using inorganic materials.

A second TFE layer 452 may be formed on the first TFE layer 451. The second TFE layer 452 may improve the flatness of an OLED device, and may protect the light emitting structure. The second TFE layer 452 may be formed using organic materials.

A third TFE layer 453 may be formed on the second TFE layer 452. The third TFE layer 453 may cover the second TFE layer 452, and may be formed in a substantially uniform thickness along a profile of the second TFE layer 452. The third TFE layer 453 together with the first TFE layer 451 and the second TFE layer 452 may reduce or prevent the light emitting structure from being deteriorated by the permeation of moisture, water, oxygen, etc. In addition, the third TFE layer 453 together with the first TFE layer 451 and the second TFE layer 452 may protect the light emitting structure from external impacts. The third TFE layer 453 may be formed using inorganic materials. Accordingly, a TFE structure 450 including the first TFE layer 451, the second TFE layer 452, and the third TFE layer 453 may be formed. In addition, a display panel 200 including the substrate 110, the semiconductor element 250, the planarization layer 270, the lower electrode 290, the pixel defining layer 310, the light emitting layer 330, the upper electrode 340, and the TFE structure 450 may be formed.

After the semiconductor element 250, the planarization layer 270, the light emitting structure, the TFE structure 450, etc. are formed on the substrate 110, the rigid glass substrate may be separated form the substrate 110.

A first lower adhesion layer 301 may be formed on a lower surface on the substrate 110. The first lower adhesion layer 301 may include a first lower adhesion layer pattern 302 and a second lower adhesion layer pattern 304. The first lower adhesion layer pattern 302 may be formed in the entire display region 10, and the second lower adhesion layer pattern 304 may be formed only in the pad electrode region 60 such that a lower surface of the display panel 200 that is located in the bending region 50 is exposed. The first lower adhesion layer 301 may be formed using OCA, PSA, etc.

A lower protection film 300 may be formed on a lower surface of the first lower adhesion layer 301. The lower protection film 300 and the display panel 200 may be bonded by the first lower adhesion layer 301. The lower protection film 300 may protect the display panel 200 from external impacts. The lower protection film 300 may include a first lower protection film pattern 351 and a second lower protection film pattern 352. The first lower protection film pattern 351 may be formed in the entire display region 10, and the second lower protection film pattern 352 may be formed only in the pad electrode region 60 such that a lower surface of the display panel 200 that is located in the bending region 50 is exposed. In addition, the first lower protection film pattern 351 may overlap the first lower adhesion layer pattern 302, and the second lower protection film pattern 352 may overlap the second lower adhesion layer pattern 304. The lower protection film 300 may be formed using, for example, PET, PEN, PP, PC, PS, PSul, PE, PPA, PES, PAR, PCO, MPPO, etc. A thickness of the lower protection film 300 may be formed in about 150 micrometers, but is not limited thereto.

A second lower adhesion layer 425 may be formed on a lower surface of first lower protection film pattern 351. The second lower adhesion layer 425 may be formed using OCA, PSA, etc.

A heat sink plate 480 may be formed on a lower surface of the second lower adhesion layer 425. The first lower protection film pattern 351 and the heat sink plate 480 may be bonded by the second lower adhesion layer 425. As the heat sink plate 480 is formed on a lower surface of the display panel 200, a heat generated in the display panel 200 may be cooled. The heat sink plate 480 may include a material that has relatively high heat conductivity. For example, the heat sink plate 480 may be formed using Al, an alloy of Al, Ag, an alloy of Ag, W, Cu, an alloy of Cu, Ni, Cr, Mo, an alloy of Mo, Ti, Pt, Ta, Nd, Sc, etc. These examples may be used alone or in a combination thereof. A thickness of the heat sink plate 480 may be formed in about 100 micrometers, but is not limited thereto.

Referring to FIG. 13, a polarizing layer 430 and a protection film 432 may be formed on the TFE structure 450. In an exemplary embodiment, the polarizing layer 430 may have a first height H1. The first height H1 may range between about 60 micrometers and about 120 micrometers. For example, the first height H1 of the polarizing layer 430 may be about 100 micrometers. The polarizing layer 430 may include a linearly polarized film and a λ/4 phase retardation film. The λ/4 phase retardation film may be formed on the TFE structure 450. The λ/4 phase retardation film may convert a phase of the light. The λ/4 phase retardation film may be formed using a birefringent film containing polymer, an orientation film of a liquid crystal polymer, alignment layer of a liquid crystal polymer, etc. The linearly polarized film may be formed on the λ/4 phase retardation film. The linearly polarized film may selectively transmit the incident light. For example, the linearly polarized film may be formed using iodine-based materials, materials containing dye, polyene-based materials, etc.

The protection film 432 may be formed on the polarizing layer 430. The protection film 432 may protect the polarizing layer 430. A thickness of the protection film 432 may be formed in about 50 micrometers, but is not limited thereto.

As illustrated in FIG. 14 and FIG. 15, a bending protection layer 460 may be formed in a portion of the peripheral region 40, the bending region 50, and a portion of the pad electrode region 60 on the display panel 200. In an exemplary embodiment, the polarizing layer 430 may be in contact with the bending protection layer 460 in a portion (e.g., peripheral region 40) where the display region 10 and the bending region 50 are adjacent to each other. The bending protection layer 460 may have an upper surface that is less than a height of an upper surface of the polarizing layer 430 (e.g., the first height H1). For example, the bending protection layer 460 may have a second height H2, and the second height H2 may be less than the first height H1. The second height H2 may range between about 50 micrometers and about 110 micrometers. In addition, the bending protection layer 460 may have a Young's modulus that ranges between 0.1 GPa and 0.7 GPa. Further, the bending protection layer 460 may overlap the first lower protection film pattern 351 in the peripheral region 40. The distance of a portion where the bending protection layer 460 and the first lower protection film pattern 351 are overlapped may be an overlap distance 70 (refer to FIG. 4). The overlap distance 70 may be less than or equal to about 350 micrometers. The bending protection layer 460 having a relatively high Young's modulus may have a relatively reduced overlap distance 70.

As illustrated in FIG. 15, the bending protection layer 460 may have a protrusion portion 466 in the peripheral region 40 (e.g., the peripheral region 40 that is located adjacent to the bending region 50). A height from a lower surface of the bending protection layer 460 to the protrusion portion 466 may be greater than the first height H1 of the polarizing layer 430, and the height from a lower surface of the bending protection layer 460 to the protrusion portion 466 may be less than a height of an upper surface of the protection film 432. For example, a height difference between the height from a lower surface of the bending protection layer 460 to the protrusion portion 466 and the first height H1 may range between about 10 micrometers and about 30 micrometers. In an exemplary embodiment, the height difference may be more than about 30 micrometers. The bending protection layer 460 may be formed using organic materials such as polyimide, epoxy-based resin, acryl-based resin, polyester, photoresist, polyacryl-based resin, polyimide-based resin, a polyamide-based resin, a siloxane-based resin, etc, and may be formed using elastic materials such as silicon, urethane, thermoplastic poly urethane (TPU), etc.

Referring to FIG. 16 and FIG. 17, the protection film 432 may be separated from the polarizing layer 430. For example, as illustrated in FIG. 17, the protrusion portion 466 may be formed in the bending protection layer 460.

Figure 18:
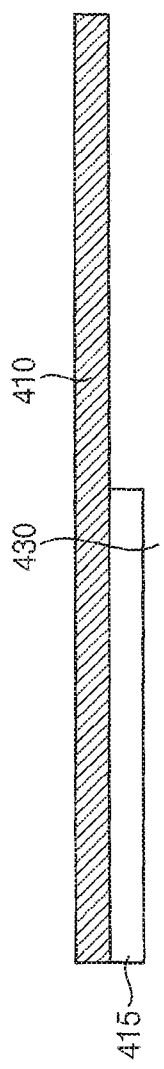
Figure 18:
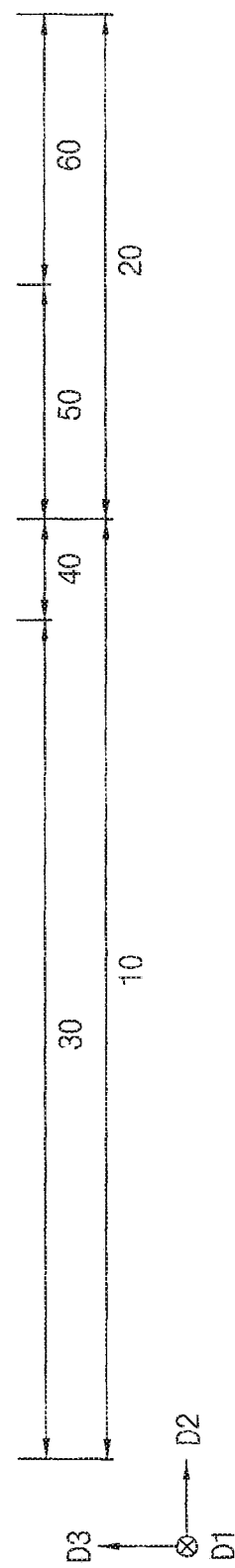

Referring to FIG. 18, a touch screen electrode layer 410 may be provided. The touch screen electrode layer 410 may include a bottom PET film, touch screen electrodes, and a top PET film, etc. The bottom PET film and the top PET film may protect the touch screen electrodes. For example, each of the top PET film and the bottom PET film may be formed using PET, PEN, PP, PC, PS, PSul, PE, PPA, PES, PAR, PCO, MPPO, etc. The touch screen electrodes may substantially have a metal mesh structure. For example, the touch screen electrodes may be formed using CNT, TCO, ITO, IGZO, ZnO, AgNW, Cu, Cr, etc.

An upper adhesion layer 415 may be formed on a lower surface of the touch screen electrode layer 410. The upper adhesion layer 415 may be formed using OCA, PSA, etc.

Figure 19:
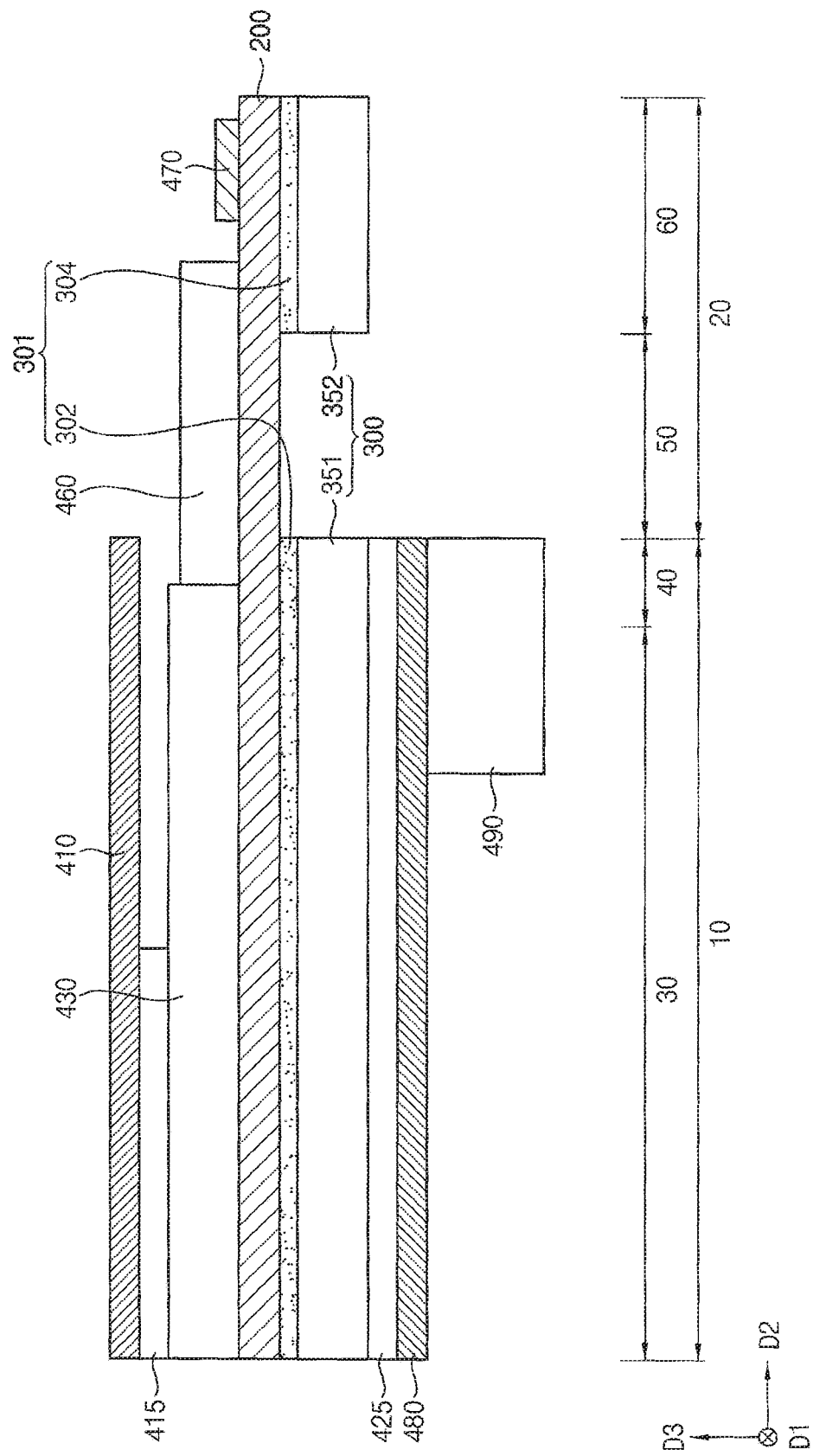

Referring to FIG. 19, the polarizing layer 430 and the touch screen electrode layer 410 may be bonded by the upper adhesion layer 415.

A third lower adhesion layer 490 may be formed on a lower surface of the heat sink plate 480. For example, the third lower adhesion layer 490 may be formed using urethane, rubber, etc. For example, the thickness of the third lower adhesion layer 490 may be formed in about 200 micrometers, but is not limited thereto.

Figure 20:
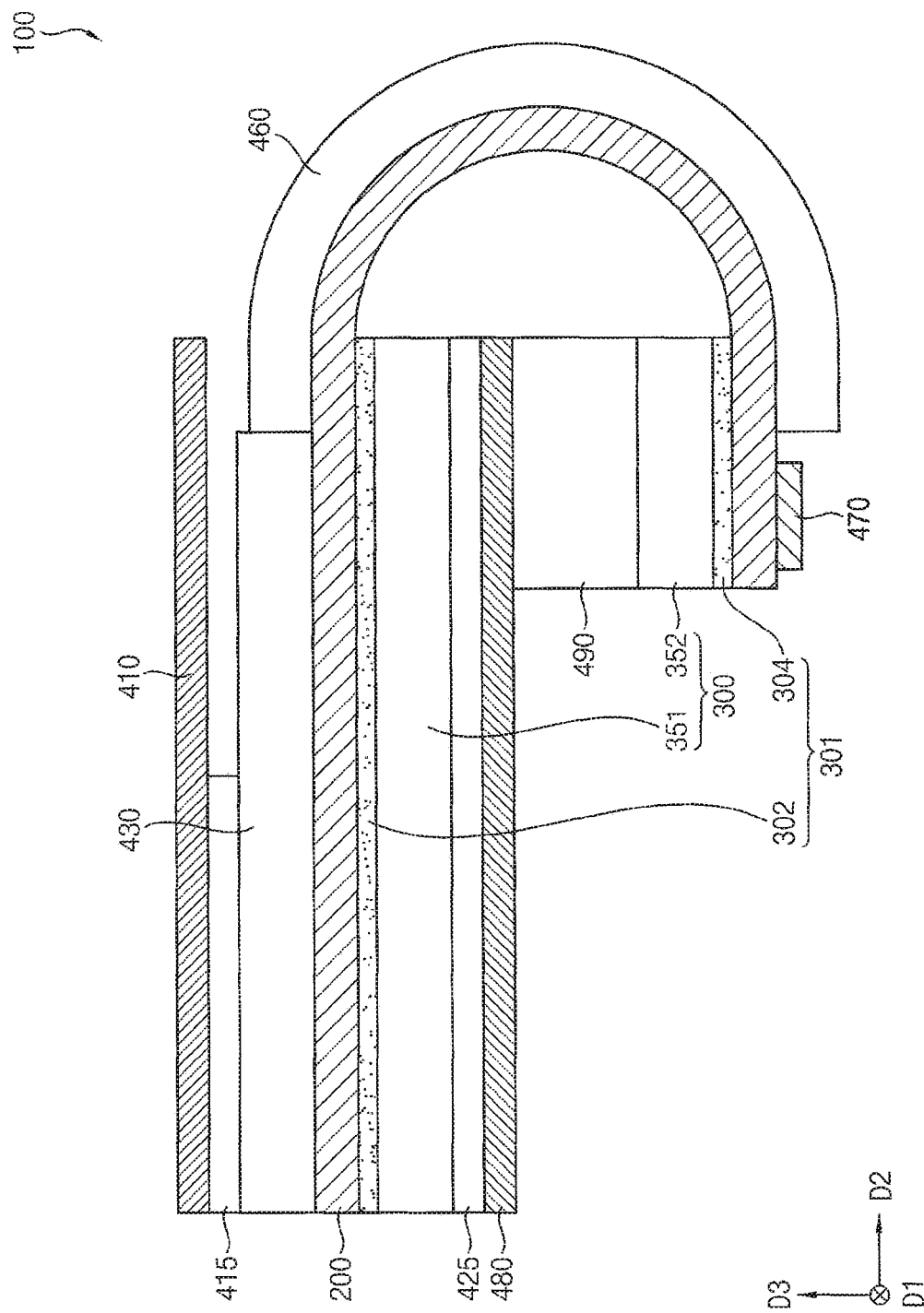

Referring to FIG. 20, as the bending region 50 is bent, the pad electrode region 60 may be located on a lower surface of an OLED device. In an exemplary embodiment, the bending region 50 may be bent on an axis with respect to a first direction D1, and the second lower protection film pattern 352 may be located on a lower surface of the heat sink plate 480. The second lower protection film pattern 352 and the heat sink plate 480 may be fixed by the third lower adhesion layer 490. Accordingly, the OLED device 100 illustrated in FIG. 4 may be manufactured.

Figure 21:
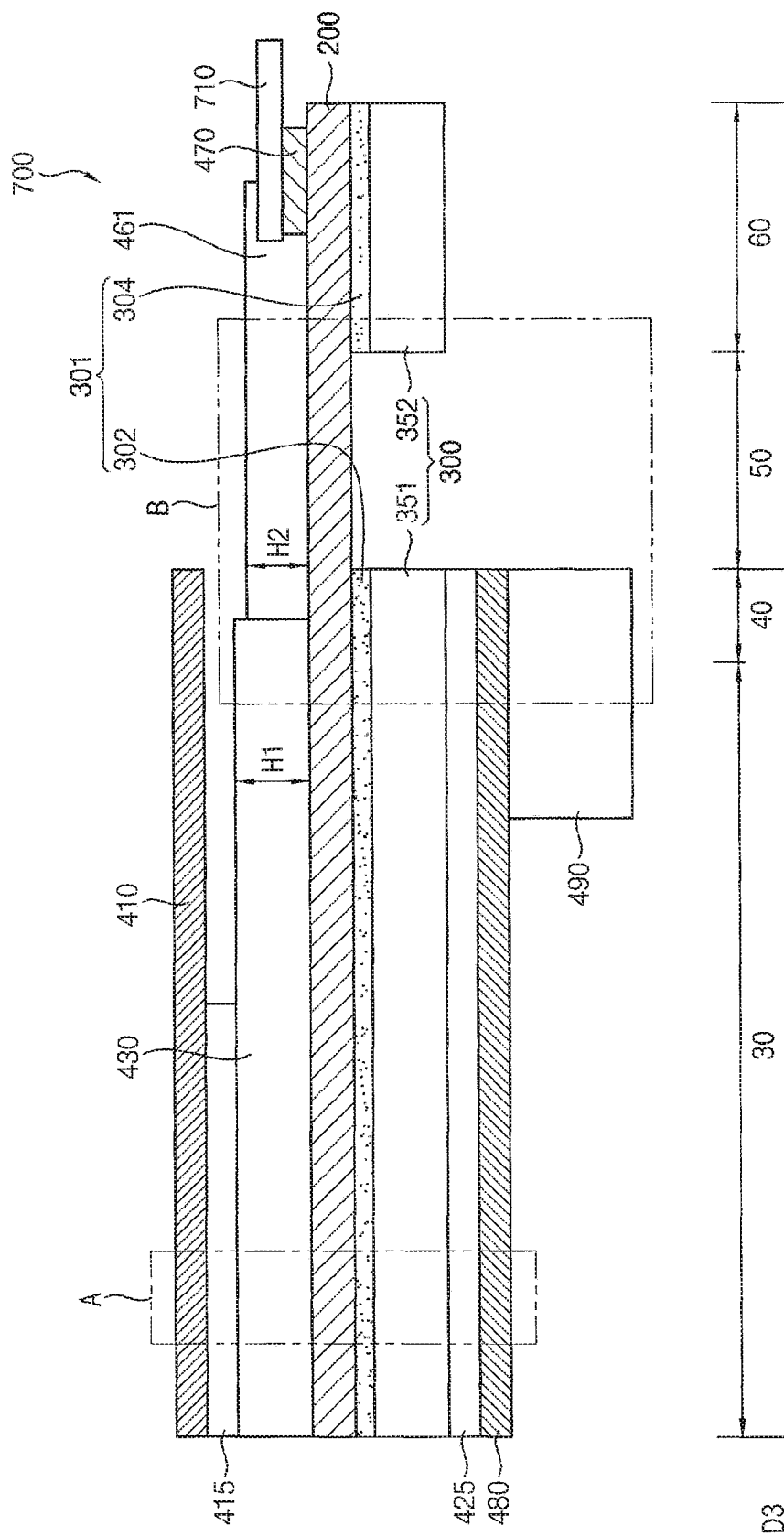
FIG. 21 is a cross-sectional view illustrating an OLED device in accordance with an exemplary embodiment.

FIG. 21 is a cross-sectional view illustrating an OLED device in accordance with an exemplary embodiment. An OLED device 700 illustrated in FIG. 21 may have a configuration substantially the same as or similar to that of an OLED device 100 described with reference to FIG. 3 except for a bending protection layer 461 and a FPCB 710. In FIG. 21, detailed descriptions for elements that are substantially the same as or similar to elements described with reference to FIG. 3 may not be repeated.

Referring to FIG. 21, an OLED device 700 may include a display panel 200, a first lower adhesion layer 301, a lower protection film 300, a second lower adhesion layer 425, a heat sink plate 480, a third lower adhesion layer 490, a polarizing layer 430, an upper adhesion layer 415, a touch screen electrode layer 410, a bending protection layer 461, a FPCB 710, a pad electrode 470, etc. Here, the lower protection film 300 may include a first lower protection film pattern 351 and a second lower protection film pattern 352, and the first lower adhesion layer 301 may include a first lower adhesion layer pattern 302 and a second lower adhesion layer pattern 304. In an exemplary embodiment, the polarizing layer 430 may have a first height H1, and the bending protection layer 461 may have a second height H2 that is less than the first height H1.

The FPCB 710 may be disposed on the pad electrode 470. The FPCB 710 may be electrically connected to an external device 101 (refer to FIG. 2).

The bending protection layer 461 may be disposed in a portion of a display region 10 or a portion of a peripheral region 40, a bending region 50, and a portion of a pad electrode region 60 on the display panel 200. In an exemplary embodiment, the polarizing layer 430 may be in contact with the bending protection layer 461 in a portion (e.g., peripheral region 40) where the display region 10 and the bending region 50 are adjacent to each other, and the bending protection layer 461 may be in contact with a portion of the pad electrode 470 and a portion of FPCB 710 in the pad electrode region 60. The bending protection layer 461 may cover a portion of the FPCB 710. Accordingly, as the bending protection layer 461 covers a portion of the FPCB 710, separation of the FPCB 710 from the pad electrode 470 may be reduced.

The present invention may be applied to various display devices including an organic light emitting display device. For example, the present invention may be applied to vehicle-display device, a ship-display device, an aircraft-display device, portable communication devices, display devices for display or for information transfer, a medical-display device, etc., but is not limited thereto.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. An organic light emitting display (OLED) device, comprising:
   a display panel comprising a display region where a plurality of pixels are disposed and a pad region that is located adjacent to a first side of the display region, the pad region comprising a bending region located in a portion of the pad region that is adjacent to the display region and a pad electrode region located in a remaining portion of the pad region, pad electrodes being disposed in the pad electrode region;
   a polarizing layer disposed on the display panel in the display region;
   a touch screen electrode layer disposed on the polarizing layer;
   an upper adhesion layer interposed between the polarizing layer and the touch screen electrode layer;
   a lower protection film disposed on a lower surface of the display panel, the lower protection film comprising:
      a first lower protection film pattern disposed in the display region; and
      a second lower protection film pattern disposed in the pad electrode region of the pad region such that a lower surface of the display panel located in the bending region is exposed; and
   a bending protection layer, where a height of the bending protection layer is less than a height of the polarizing layer, the bending protection layer being disposed in the bending region on the display panel,
   wherein the display region comprises:
      a light emitting region configured for emission of light;
      a peripheral region surrounding the light emitting region;
   a plurality of wirings disposed on the peripheral region; and
   connection electrodes disposed between the bending protection layer and the display panel, the connection electrodes being electrically connected to the pixels and the pad electrodes, and
   wherein each of the plurality of the pixels disposed in the display region comprises:
      a semiconductor element disposed on the substrate;
      a lower electrode disposed on the semiconductor element;
      a light emitting layer disposed on the lower electrode;
      an upper electrode disposed on the light emitting layer; and
      a thin film encapsulation structure disposed on the upper electrode,
   wherein a portion of the peripheral region is interposed between the light emitting region and the bending region,
   wherein the bending protection layer comprises a protrusion portion in the peripheral region that is located adjacent to the bending region,
   wherein a height from a lower surface of the bending protection layer to the protrusion portion is greater than a height of the polarizing layer,
   wherein the polarizing layer is in contact with the bending protection layer in a portion where the display region and the bending region are adjacent to each other,
   wherein the polarizing layer and the bending protection layer are in contact with the display panel,
   wherein the polarizing layer is disposed in the light emitting region and a portion of the peripheral region that is located adjacent to the bending region on the display panel,
   wherein the bending protection layer is disposed in a portion of the peripheral region that is located adjacent to the bending region, the bending region, and a portion of the pad electrode region,
   wherein the bending protection layer is in contact with the polarizing layer in the peripheral region that is located adjacent to the bending region,
   wherein a height of the polarizing layer is in a range between about 60 micrometers and about 120 micrometers,
   wherein a first height of the polarizing layer is less than a second height from a lower surface of the bending protection layer to the protrusion portion,
   wherein a height difference between the first and second heights is in a range between about 10 micrometers and about 30 micrometers,
   wherein the first lower protection film pattern is disposed in the light emitting region and the peripheral region on a lower surface of the display panel, and the first lower protection film pattern and the bending protection layer are overlapped in the peripheral region in a plan view,
   wherein the bending region is bent on an axis with respect to a first direction corresponding to a row direction in a plan view of the OLED device, and the second lower protection film pattern is disposed on a lower surface of the first lower protection film pattern,
   wherein the polarizing layer is on the thin film encapsulation structure,
   wherein the semiconductor element comprises:
      an active layer disposed on the substrate;
      a gate insulation layer disposed on the active layer, the gate insulation layer exposing an upper surface of the substrate that is located in the bending region;

a gate electrode disposed on the gate insulation layer;
an insulating interlayer disposed on the gate electrode, the insulating interlayer exposing the upper surface of the substrate that is located in the bending region; and
source and drain electrodes disposed on the insulating interlayer,
wherein a portion of the touch screen electrode layer is overlapped with a portion of the bending protective layer in a peripheral region in a plan view,
wherein an overlap distance of the bending protection layer and first lower protection film pattern is less than or equal to about 350 micrometers.

2. The OLED device of claim 1, wherein the bending protection layer has a Young's modulus that ranges between 0.1 GPa and 0.7 Gpa.

3. The OLED device of claim 1, wherein a height of the polarizing layer including λ/4 phase retardation film is about 100 micrometers.

4. The OLED device of claim 1, wherein the thin film encapsulation structure comprises:
a first thin film encapsulation layer;
a second thin film encapsulation layer disposed on the first thin film encapsulation layer; and
a third thin film encapsulation layer disposed on the second thin film encapsulation layer,
wherein the first thin film encapsulation layer is disposed closest to the substrate, and
wherein the third thin film encapsulation layer is disposed farthest from the substrate.

5. The OLED device of claim 4, wherein the first thin film encapsulation layer has a shape with respect to a cross-sectional view of the OLED device such that a middle portion of the first thin film encapsulation layer is closer to the substrate than left and right portions of the first thin film encapsulation layer, and
wherein second thin film encapsulation layer has a shape with respect to a cross-sectional view of the OLED device such that a top surface of the second thin film encapsulation layer is flat and wherein a bottom surface of the second thin film encapsulation layer has a shape such that a middle portion of the second thin film encapsulation layer is closer to the substrate than left and right portions of the second thin film encapsulation layer, and
wherein the third thin film encapsulation layer has a shape with respect to a cross-sectional view of the OLED device such that a bottom surface of the third thin film encapsulation layer is flat and a top surface of the third thin film encapsulation layer is flat.

6. The OLED device of claim 1, wherein the lower electrode has a relatively flat shape with respect to a cross-sectional view of the OLED device, and
wherein the upper electrode has a shape with respect to a cross-sectional view of the OLED device such that a middle portion of the upper electrode is closer to the substrate than left and right portions of the upper electrode.

7. The OLED device of claim 6, further comprising:
a planarization layer disposed directly under the lower electrode, wherein a via is provided in the planarization layer to electrically connect the semiconductor element with the lower electrode.

8. The OLED device of claim 1, wherein the protrusion portion has a sloped shape such that a widest part of the protrusion portion corresponds to a region of the protrusion portion that abuts the polarizing layer, and wherein the protrusion portion gets smaller in width in direct relation to an increasing distance of regions of the protrusion portion from the polarizing layer.

9. An organic light emitting display (OLED) device, comprising:
a display panel comprising a display region where a plurality of pixels are disposed and a pad region that is located adjacent to a first side of the display region, the pad region comprising a bending region located in a portion of the pad region that is adjacent to the display region and a pad electrode region located in a remaining portion of the pad region, pad electrodes being disposed in the pad electrode region;
a polarizing layer disposed on the display panel in the display region;
a touch screen electrode layer disposed on the polarizing layer; and
an upper adhesion layer interposed between the polarizing layer and the touch screen electrode layer,
a lower protection film disposed on a lower surface of the display panel, the lower protection film comprising:
a first lower protection film pattern disposed in the display region; and
a second lower protection film pattern disposed in the pad electrode region of the pad region such that a lower surface of the display panel located in the bending region is exposed; and
a bending protection layer, where a height of the bending protection layer is less than a height of the polarizing layer, the bending protection layer being disposed in the bending region on the display panel,
wherein the display region comprises:
a light emitting region configured for emission of light;
a peripheral region surrounding the light emitting region;
a plurality of wirings disposed on the peripheral region;
connection electrodes disposed between the bending protection layer and the display panel, the connection electrodes being electrically connected to the pixels and the pad electrodes;
each of the plurality of the pixels disposed in the display region comprises:
a semiconductor element disposed on the substrate;
a lower electrode disposed on the semiconductor element;
a light emitting layer disposed on the lower electrode;
an upper electrode disposed on the light emitting layer; and
a thin film encapsulation structure disposed on the upper electrode,
wherein a portion of the peripheral region is interposed between the light emitting region and the bending region,
wherein the polarizing layer is in contact with the bending protection layer in a portion where the display region and the bending region are adjacent to each other,
wherein the polarizing layer and the bending protection layer are in contact with the display panel,
wherein the polarizing layer is disposed in the light emitting region and a portion of the peripheral region that is located adjacent to the bending region on the display panel,
wherein the bending protection layer is disposed in a portion of the peripheral region that is located adjacent to the bending region, the bending region, and a portion of the pad electrode region, wherein the bending protection layer is in contact with the polarizing layer in the peripheral region that is located adjacent to the bending region, wherein a height of the polarizing layer is in a range between about 60 micrometers and about 120 micrometers, wherein the first lower protection film pattern is disposed in the light emitting region and the peripheral region on a lower surface of the display panel, and the first lower protection film pattern and the bending protection layer are overlapped in the peripheral region in a plan view, wherein the bending region is bent on an axis with respect to a first direction corresponding to a row direction in a plan view of the OLED device, and the second lower protection film pattern is disposed on a lower surface of the first lower protection film pattern, wherein the polarizing layer is on the thin film encapsulation structure, wherein the semiconductor element comprises:
an active layer disposed on the substrate;
a gate insulation layer disposed on the active layer, the gate insulation layer exposing an upper surface of the substrate that is located in the bending region;
a gate electrode disposed on the gate insulation layer;
an insulating interlayer disposed on the gate electrode, the insulating interlayer exposing the upper surface of the substrate that is located in the bending region; and
source and drain electrodes disposed on the insulating interlayer, and wherein a portion of the touch screen electrode layer is overlapped with a portion of the bending protective layer in a peripheral region in a plan view, wherein an overlap distance of the bending protection layer and first lower protection film pattern is less than or equal to about 350 micrometers.

10. The OLED device of claim 9, wherein the bending protection layer comprises a protrusion portion in the peripheral region that is located adjacent to the bending region, wherein a first height of the polarizing layer is less than a second height from a lower surface of the bending protection layer to the protrusion portion, and wherein a height difference between the first and second heights is in a range between about 10 micrometers and about 30 micrometers.

11. The OLED device of claim 9, wherein the bending protection layer has a Young's modulus that ranges between 0.1 GPa and 0.7 Gpa.

12. The OLED device of claim 9, wherein a height of the polarizing layer including λ/4 phase retardation film is about 100 micrometers.

13. The OLED device of claim 9, wherein the thin film encapsulation structure comprises:
a first thin film encapsulation layer;
a second thin film encapsulation layer disposed on the first thin film encapsulation layer; and
a third thin film encapsulation layer disposed on the second thin film encapsulation layer, wherein the first thin film encapsulation layer is disposed closest to the substrate, and wherein the third thin film encapsulation layer is disposed farthest from the substrate.

14. The OLED device of claim 13, wherein the first thin film encapsulation layer has a shape with respect to a cross-sectional view of the OLED device such that a middle portion of the first thin film encapsulation layer is closer to the substrate than left and right portions of the first thin film encapsulation layer, and wherein second thin film encapsulation layer has a shape with respect to a cross-sectional view of the OLED device such that a top surface of the second thin film encapsulation layer is flat and wherein a bottom surface of the second thin film encapsulation layer has a shape such that a middle portion of the second thin film encapsulation layer is closer to the substrate than left and right portions of the second thin film encapsulation layer, and wherein the third thin film encapsulation layer has a shape with respect to a cross-sectional view of the OLED device such that a bottom surface of the third thin film encapsulation layer is flat and a top surface of the third thin film encapsulation layer is flat.

15. The OLED device of claim 9, wherein the lower electrode has a relatively flat shape with respect to a cross-sectional view of the OLED device, and wherein the upper electrode has a shape with respect to a cross-sectional view of the OLED device such that a middle portion of the upper electrode is closer to the substrate than left and right portions of the upper electrode.

16. The OLED device of claim 15, further comprising:
a planarization layer disposed directly under the lower electrode, wherein a via is provided in the planarization layer to electrically connect the semiconductor element with the lower electrode.

17. The OLED device of claim 9, wherein the protrusion portion has a sloped shape such that a widest part of the protrusion portion corresponds to a region of the protrusion portion that abuts the polarizing layer, and wherein the protrusion portion gets smaller in width in direct relation to an increasing distance of regions of the protrusion portion from the polarizing layer.

* * * * *